United States Patent
Fattal et al.

(10) Patent No.: US 9,093,819 B2
(45) Date of Patent: Jul. 28, 2015

(54) VERTICAL-CAVITY SURFACE-EMITTING LASERS WITH NON-PERIODIC GRATINGS

(75) Inventors: David A. Fattal, Mountain View, CA (US); Michael Renne Ty Tan, Menlo Park, CA (US); Raymond G. Beausoleil, Redmond, WA (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 95 days.

(21) Appl. No.: 13/387,030

(22) PCT Filed: Jan. 29, 2010

(86) PCT No.: PCT/US2010/022632
§ 371 (c)(1),
(2), (4) Date: Jan. 25, 2012

(87) PCT Pub. No.: WO2011/093885
PCT Pub. Date: Aug. 4, 2011

(65) Prior Publication Data
US 2012/0120977 A1    May 17, 2012

(51) Int. Cl.
*H01S 5/18* (2006.01)
*H01S 5/187* (2006.01)
(Continued)

(52) U.S. Cl.
CPC ............ *H01S 5/18363* (2013.01); *H01S 5/105* (2013.01); *H01S 5/18308* (2013.01); *H01S 5/18355* (2013.01); *H01S 5/18361* (2013.01);
(Continued)

(58) Field of Classification Search
CPC ... H01S 5/0651; H01S 5/105; H01S 5/18363; H01S 5/18388; H01S 5/18391; H01S 5/18394

USPC .......................................... 372/50.11, 50.124
See application file for complete search history.

(56) References Cited

U.S. PATENT DOCUMENTS 5,140,149 A    8/1992    Sakata et al.
5,726,805 A    3/1998    Kaushik et al.
(Continued)

FOREIGN PATENT DOCUMENTS

CN    2571034       9/2003
CN    1507684 A    6/2004
(Continued)

OTHER PUBLICATIONS

International Search Report and Written Opinion, Aug. 2, 2011. PCT Application No. PCT/US2010/054740.
(Continued)

*Primary Examiner* — Yuanda Zhang
*Assistant Examiner* — Michael Carter
(74) *Attorney, Agent, or Firm* — Olympic Patent Works PLLC

(57) ABSTRACT

Various embodiments of the present, invention are directed to surface-emitting lasers with the cavity including at least one single-layer, non-periodic, sub-wavelength grating. In one embodiment, a surface-emitting laser comprises a grating layer (112) configured with a non-periodic, sub-wavelength grating (122), a reflective layer, and a light-emitting layer (102) disposed between the grating layer and the reflector. The non-periodic, sub-wavelength grating is configured with a grating pattern that controls the shape of one or more internal cavity modes, and controls the shape of one or more external transverse modes emitted from the surface-emitting laser.

20 Claims, 23 Drawing Sheets

(51) Int. Cl.
*H01S 5/183* (2006.01)
*H01S 5/10* (2006.01)
*H01S 5/22* (2006.01)

(52) U.S. Cl.
CPC ......... *H01S5/18388* (2013.01); *H01S 5/18391* (2013.01); *H01S 5/18394* (2013.01); *H01S 5/2214* (2013.01); *H01S 2301/18* (2013.01)

(56) References Cited

U.S. PATENT DOCUMENTS

| | | |
|---|---|---|
| 6,195,381 B1 | 2/2001 | Botez et al. |
| 6,590,267 B1 | 7/2003 | Goodwin-Johansson et al. |
| 6,683,898 B2 * | 1/2004 | Østergaard et al. ........ 372/43.01 |
| 6,697,405 B2 | 2/2004 | Kitatani et al. |
| 6,707,548 B2 | 3/2004 | Kreimer et al. |
| 6,741,624 B2 | 5/2004 | Mears et al. |
| 6,785,320 B1 | 8/2004 | Amos et al. |
| 6,818,959 B2 | 11/2004 | Montelius et al. |
| 6,894,836 B2 | 5/2005 | Christenson |
| 6,914,231 B1 | 7/2005 | Stone |
| 7,096,498 B2 | 8/2006 | Judge |
| 7,106,920 B2 | 9/2006 | Liu |
| 7,173,764 B2 | 2/2007 | Carr et al. |
| 7,180,930 B2 | 2/2007 | Takaki et al. |
| 7,221,691 B2 | 5/2007 | Johnson et al. |
| 7,302,130 B2 | 11/2007 | Stone |
| 7,304,781 B2 | 12/2007 | Chang-Hasnain et al. |
| 7,386,205 B2 | 6/2008 | Wang et al. |
| 7,535,944 B1 | 5/2009 | Guilfoyle et al. |
| 7,680,371 B2 | 3/2010 | Cheben et al. |
| 7,693,205 B2 | 4/2010 | Uchida |
| 2002/0073338 A1 | 6/2002 | Burrows et al. |
| 2002/0080493 A1 | 6/2002 | Tsai et al. |
| 2003/0048824 A1 | 3/2003 | Shinagawa et al. |
| 2003/0235229 A1 | 12/2003 | Deng et al. |
| 2003/0235370 A1 | 12/2003 | Taillaert et al. |
| 2005/0013334 A1 | 1/2005 | Watanabe et al. |
| 2006/0232776 A1 | 10/2006 | Hairston et al. |
| 2006/0245464 A1 | 11/2006 | Hori et al. |
| 2006/0262250 A1 | 11/2006 | Hobbs |
| 2006/0273284 A1 | 12/2006 | Hirose |
| 2007/0115553 A1 | 5/2007 | Chang-Hasnain et al. |
| 2007/0153860 A1 | 7/2007 | Chang-Hasnain et al. |
| 2007/0165214 A1 | 7/2007 | Wu et al. |
| 2007/0201527 A1 * | 8/2007 | Hori et al. ................ 372/50.124 |
| 2008/0267236 A1 * | 10/2008 | Sigalas et al. ............. 372/44.01 |
| 2009/0196319 A1 * | 8/2009 | Hori et al. ................ 372/50.124 |
| 2009/0324248 A1 | 12/2009 | Shiraki |
| 2010/0128749 A1 | 5/2010 | Amann et al. |
| 2010/0316083 A1 | 12/2010 | Chang-Hasnain et al. |
| 2011/0188119 A1 | 8/2011 | Mathai et al. |
| 2012/0105962 A1 | 5/2012 | Fattal et al. |

FOREIGN PATENT DOCUMENTS

| | | |
|---|---|---|
| CN | 1595221 | 3/2005 |
| CN | 1916668 | 2/2007 |
| JP | 2009-188153 | 8/2009 |
| KR | 10-20080009280 | 1/2008 |
| KR | 10-20080099172 | 11/2008 |
| WO | WO-2006125196 | 11/2006 |
| WO | WO-2011008216 | 1/2011 |
| WO | WO-2012105945 | 8/2012 |

OTHER PUBLICATIONS

International Search Report and Written Opinion, Sep. 27, 2010. PCT Application No. PCT/US2010/022632.

Srinivasan, Kartik, et al.. "Fabrication-tolerant high quality factor photonic crystal microcavities." arXiv preprint physics/0312060 (2003).

Berseth, C.-A. et al., "Vertical cavity surface emitting lasers incorporating structured mirrors patterned by electron-beam lithography", J. Vac. Sci. Technol. B, Nov. 1999, vol. 17, No. 6, pp. 3222-3225.

Chang-Hasnain, C. J. et al., "Tunable VCSEL Using High Contrast Grating", OSA CLE02009, May 2009.

Christensen, et al., "Low-distortion hybrid optical shuffle concept", Optics Letters, Feb. 1, 1999, pp. 169-171, vol. 24, No. 3.

European Search Report (Supplementary), Apr. 26, 2013, EP Application No. 09849901.5.

Fattal, David, et al., "Flat Dielectric Grating Reflectors with High Focusing Power", 8 pages, <http://arvix.org/PScache/arxiv/pdf/1001/1 001.3711v1.pdf>, Jan. 21, 2010.

International Search Report, Apr. 20, 2010, PCT Patent Application No. PCT/US2009/051026.

International Search Report, Sep. 28, 2011, PCT Patent Application No. PCT/US2011/023219.

International Search Report, May 31, 2010, PCT Patent Application No. PCT/US2009/058006.

Marino, Francesco, et al., "Single Mode Operation and Transverse Mode Control in VCSELs Induced by Frequency Selective Feedback", 3 pages, Dept. de Fisica Interdisciplinar, Institute Mediteraneo de Estudios Avanzados (CSIC-UIB), C/Miquel Marques 21, E-07190 Esporles, Spain.

Zhou, Ye, et al., "Transverse Mode Control in High-Contrast Subwavelength Grating VCSEL", 2 pages, Department of Electrical Engineering and Computer Sciences, University of California, Berkeley, USA, May 6-11, 2007.

Chang-Hasnain, C.J. et al., "High-Contrast Grating VCSELs", May/Jun. 2009, IEEE Journal of Selected Topics in Quantum Electronics, vol. 15, No. 3.

* cited by examiner

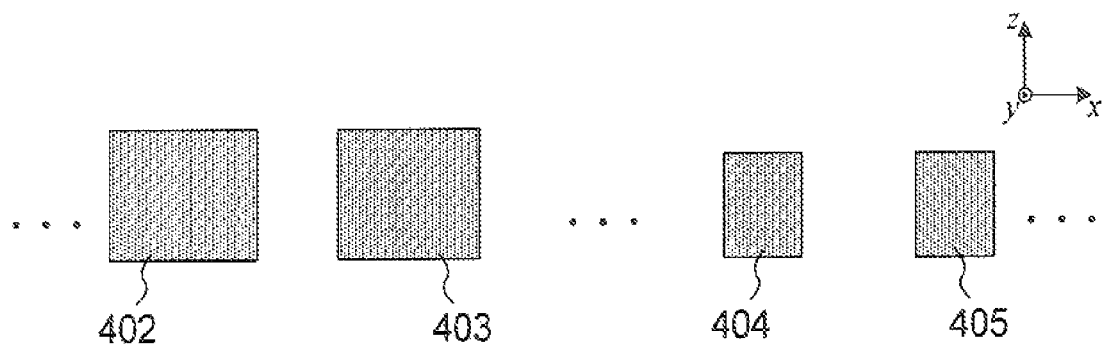
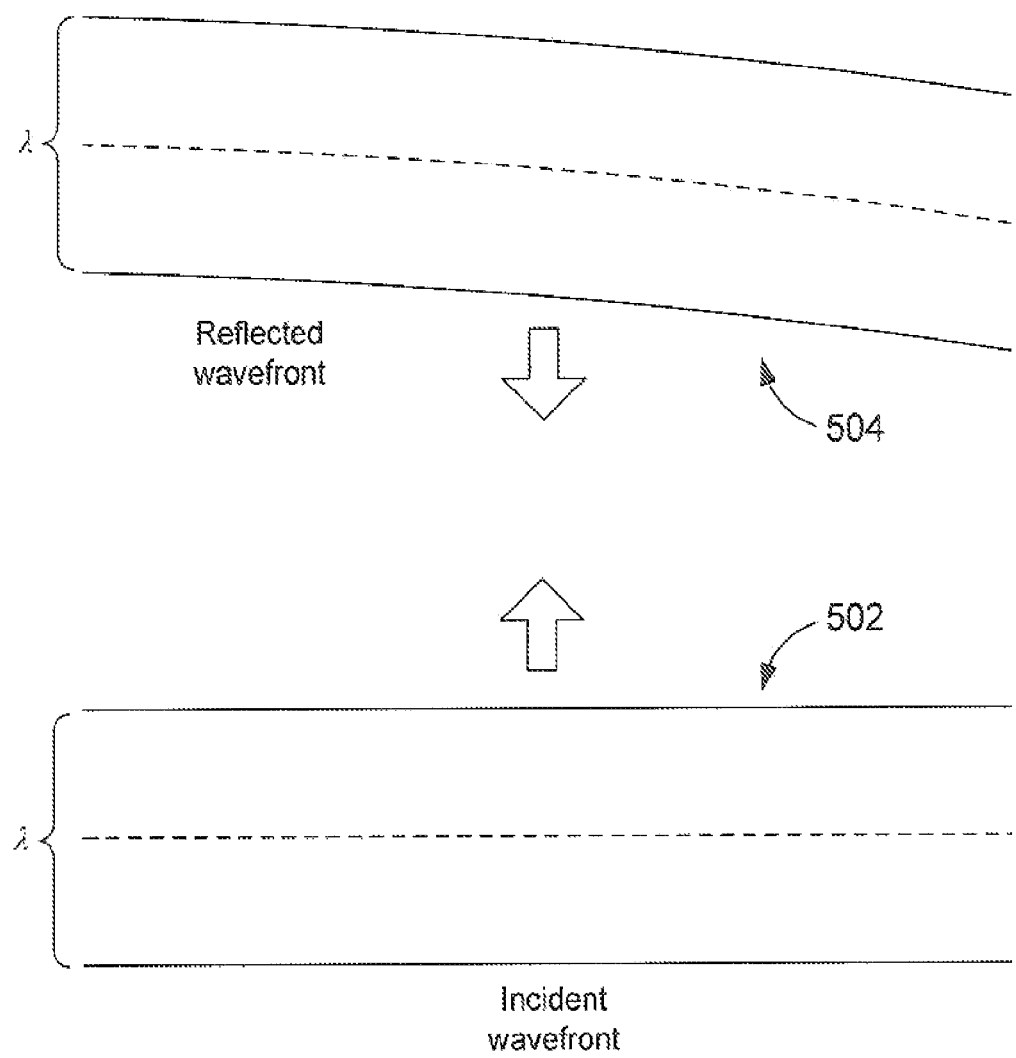
Figure 5

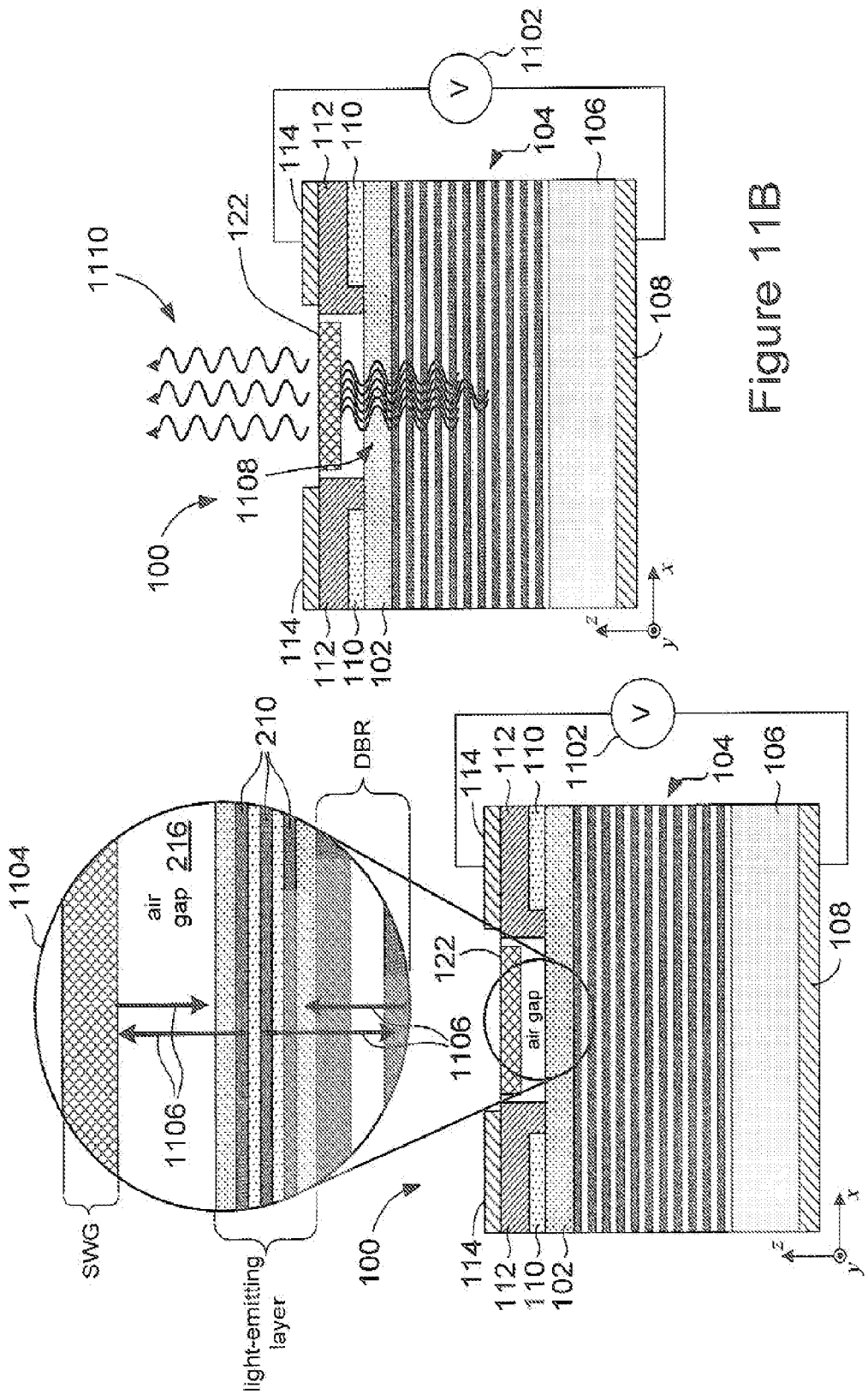

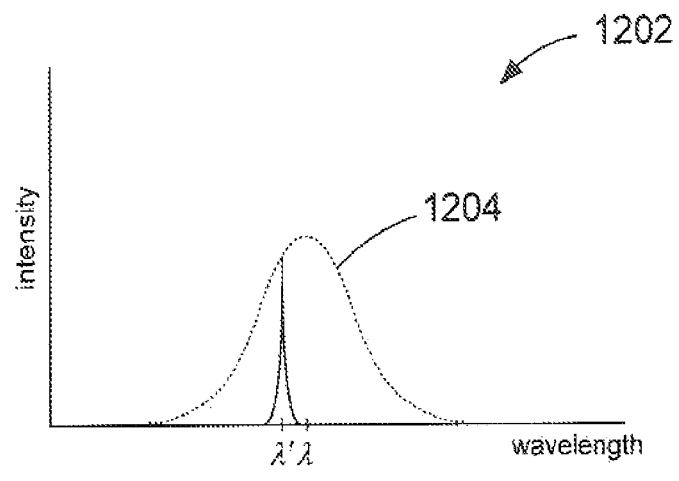
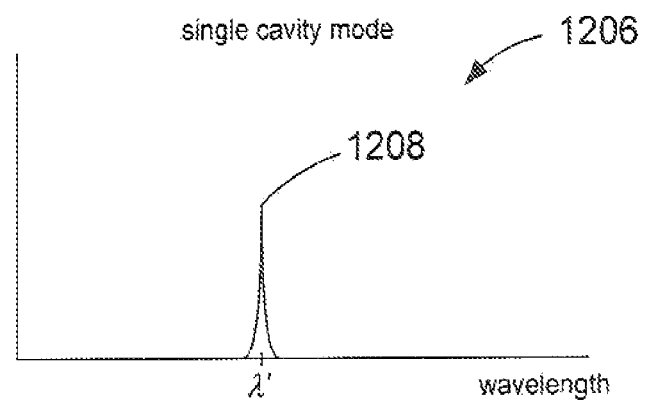
Figure 12

VERTICAL-CAVITY SURFACE-EMITTING LASERS WITH NON-PERIODIC GRATINGS

TECHNICAL FIELD

Various embodiments of the present invention relate to lasers, and in particular, to semiconductor lasers.

BACKGROUND

Semiconductor lasers represent one of the most important class of lasers in use today because they can be used in a wide variety of applications including displays, solid-state lighting, sensing, printing, and telecommunications just to name a few. The two types of semiconductor lasers primarily in use are edge-emitting lasers and surface-emitting lasers. Edge-emitting lasers generate light traveling in a direction substantially parallel to the light-emitting layer. On the other hand, surface-emitting lasers generate light traveling normal to the light-emitting layer. Surface-emitting layers have a number of advantages over typical edge-emitting lasers: they emit light more efficiently and can be arranged to form two-dimensional, light-emitting arrays.

Surface-emitting lasers configured with the light-emitting layer sandwiched between two reflectors are referred to as vertical-cavity surface-emitting lasers ("VCSELs"). The reflectors are typically distributed Bragg reflectors ("DBRs") that ideally form a reflective cavity with greater than 99% reflectivity for optical feedback. DBRs are composed of multiple alternating layers, each layer composed of a dielectric or semiconductor material with periodic refractive index variation. Two adjacent layers within a DBR have different refractive indices and are referred to as "DBR pairs." DBR reflectivity and bandwidth depend on the refractive-index contrast of constituent materials of each layer and on the thickness of each layer. The materials used to form DBR pairs typically have similar compositions and, therefore, have relatively small refractive-index differences. Thus, in order to achieve a cavity reflectivity of greater than 99%, and provide a narrow mirror bandwidth, DBRs are configured with anywhere from about 15 to about 40 or more DBR pairs. However, fabricating DBRs with greater than 99% reflectivity has proven to be difficult, especially for VCSELs designed to emit light with wavelengths in the blue-green and long-infrared portions of the electromagnetic spectrum.

Physicists and engineers continue to seek improvements in VCSEL design, operation, and efficiency.

BRIEF DESCRIPTION OF THE DRAWINGS

FIG. 5 shows a cross-sectional view of lines from two separate grating sub-patterns revealing how the reflected wavefront changes in accordance with one or more embodiments of the present invention.

FIGS. 11A-11B show cross-sectional views of the VCSEL configured and operated in accordance with one or more embodiments of the present invention.

FIG. 12 shows example plots of a hypothetical cavity mode and intensity or gain profile of light emitted from a light-emitting layer of a VCSEL configured in accordance with one or more embodiments of the present invention.

DETAILED DESCRIPTION

Various embodiments of the present invention are directed to VCSEL arrays where each VCSEL lases at a different wavelength. Each VCSEL within the VCSEL array includes a non-periodic sub-wavelength grating ("SWG") and a DBR that form an optical cavity. The SWG of each VCSEL has a different grating configuration enabling each VCSEL to lase at a different wavelength. The SWG of each VCSEL can be configured to control the shape of internal cavity modes and the shape of external modes emitted from the VCSEL. Each VCSEL has a small mode volume, an approximately single spatial output mode, emit light over a narrow wavelength range, and can be configured to emit light with a single polarization.

In the following description, the term "light" refers to electromagnetic radiation with wavelengths in the visible and non-visible portions of the electromagnetic spectrum, including infrared and ultra-violet portions of the electromagnetic spectrum.

Figure 1A:
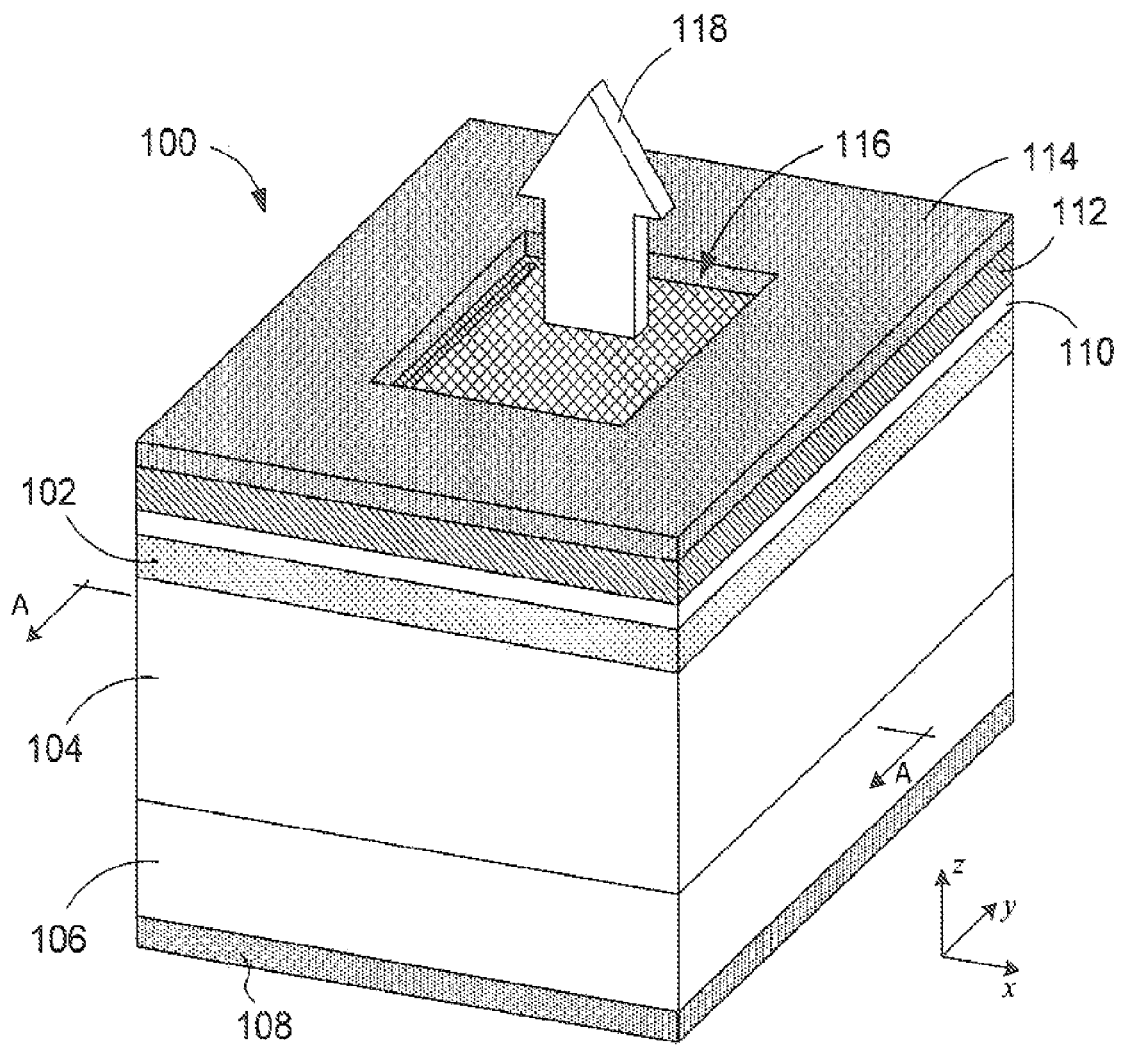
FIG. 1A shows an isometric view of an example VCSEL configured in accordance with one or more embodiments of the present invention.
Figure 1B:
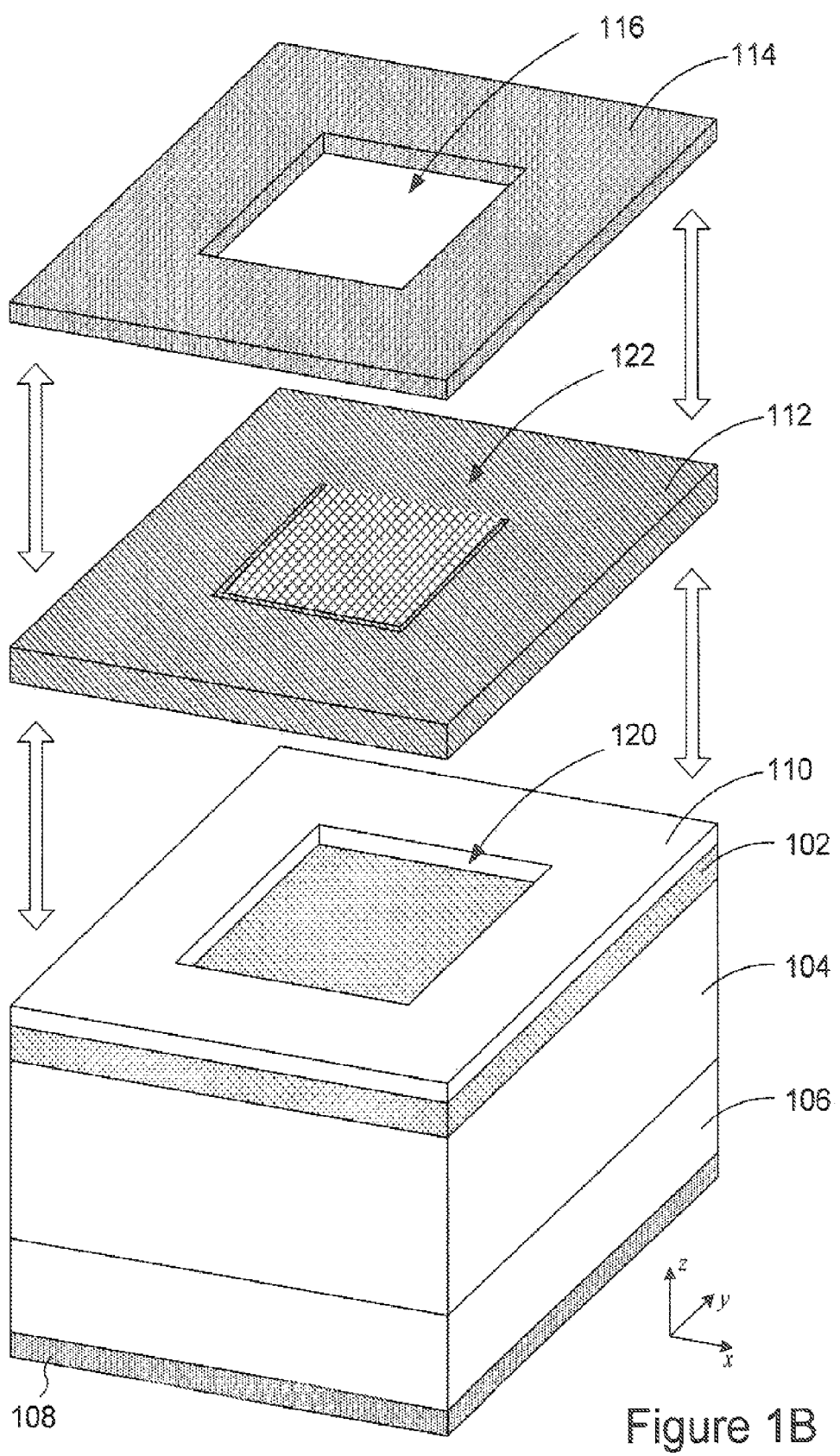
FIG. 1B shows an exploded isometric view of the VCSEL shown in FIG. 1A configured in accordance with one or more embodiments of the present invention.

Vertical-Cavity Surface-Emitting Lasers with Non-Periodic Sub-Wavelength Gratings FIG. 1A shows an isometric view of an example VCSEL 100 configured in accordance with one or more embodiments of the present invention. The VCSEL 100 includes a light-emitting layer 102 disposed on a distributed Bragg reflector ("DBR") 104. The DBR 104 is in turn disposed on a substrate 106 which is disposed on a first electrode 108. The VCSEL 100 also includes an insulating layer 110 disposed on the light-emitting layer 102, a gating layer 112 disposed on the layer 110, and a second electrode 114 disposed on the grating layer 112. As shown in the example of FIG. 1A, the second electrode 114 is configured with a rectangular-shaped opening 116 exposing a portion of the grating layer 112. The opening 116 allows light emitted from the light-emitting layer 102 to exit the VCSEL substantially perpendicular to the xy-plane of the layers, as indicated by directional arrow 118 (i.e., light is emitted from the VCSEL 100 through the opening in the z-direction). FIG. 1B shows an exploded isometric view of the VCSEL 100 configured in accordance with one or more embodiments of the present invention. The isometric view reveals an opening 120 in the insulating layer 110 and a SWG 122 in the grating layer 112. The opening 120 allows light emitted from the light-emitting layer 102 to reach the SWG 122. Note that embodiments of the present invention are not limited to the openings 116 and 120 being rectangular shaped. In other embodiments, the openings in the second electrode and the insulating layer can be square, circular, elliptical or any other suitable shape.

The layers 104, 106, and 112 are composed of a various combinations of suitable compound semiconductor materials. Compound semiconductors include III-V compound semiconductors and II-VI compound semiconductors. III-V compound semiconductors are composed of column IIIa elements selected from boron ("B"), aluminum ("Al"), gallium ("Ga"), and indium ("In") in combination with column Va elements selected from nitrogen ("N"), phosphorus ("P"), arsenic ("As"), and antimony ("Sb"). III-V compound semiconductors are classified according to the relative quantities of III and V elements, such as binary compound semiconductors, ternary compound semiconductors, and quaternary compound semiconductors. For example, binary semiconductor compounds include, but are not limited to, GaAs, GaAl, InP, InAs, and GaP; ternary compound semiconductors include, but are not limited to, $In_yGa_{y-1}As$ or $GaAs_yP_{1-y}$, where y ranges between 0 and 1; and quaternary compound semiconductors include, but are not limited to, $In_xGa_{1-x}As_yP_{1-y}$, where both x and y independently range between 0 and 1. II-VI compound semiconductors are composed of column IIb elements selected from zinc ("Zn"), cadmium ("Cd"), mercury ("Hg") in combination with VIa elements selected from oxygen ("O"), sulfur ("S"), and selenium ("Se"). For example, suitable II-VI compound semiconductors includes, but are not limited to, CdSe, ZnSe, ZnS, and ZnO are examples of binary II-VI compound semiconductors.

The layers of the VCSEL 100 can be formed using chemical vapor deposition, physical vapor deposition, or wafer bonding. The SWG 122 can be formed in the grating layer 112 using reactive ion etching, focusing beam milling, or nanoimprint lithography and the grating layer 112 bonded to the insulating layer 110.

In certain embodiments, the layers 104 and 106 are doped with a p-type impurity while the layer 112 is doped with an n-type impurity. In other embodiments, the layers 104 and 106 are doped with an n-type impurity while the layer 112 is doped with a p-type impurity. P-type impurities are atoms incorporated into the semiconductor lattice that introduce vacant electronic energy levels called "holes" to the electronic band gaps of the layers. These dopants are also called "electron acceptors." On the other hand, n-type impurities are atoms incorporated into the semiconductor lattice that introduce filled electronic energy levels to the electronic band gaps of the layers. These dopants are called "electron donors." In III-V compound semiconductors, column VI elements substitute for column V atoms in the III-V lattice and serve as n-type dopants, and column II elements substitute for column III atoms in the III-V lattice to serve as p-type dopants.

The insulating layer 110 can be composed of an insulating material, such $SiO_2$ or $Al_2O_3$ or another suitable material having a large electronic band gap. The electrodes 108 and 114 can be composed of a suitable conductor, such as gold ("Au"), silver ("Ag"), copper ("Cu"), or platinum ("Pt").

Figure 2:
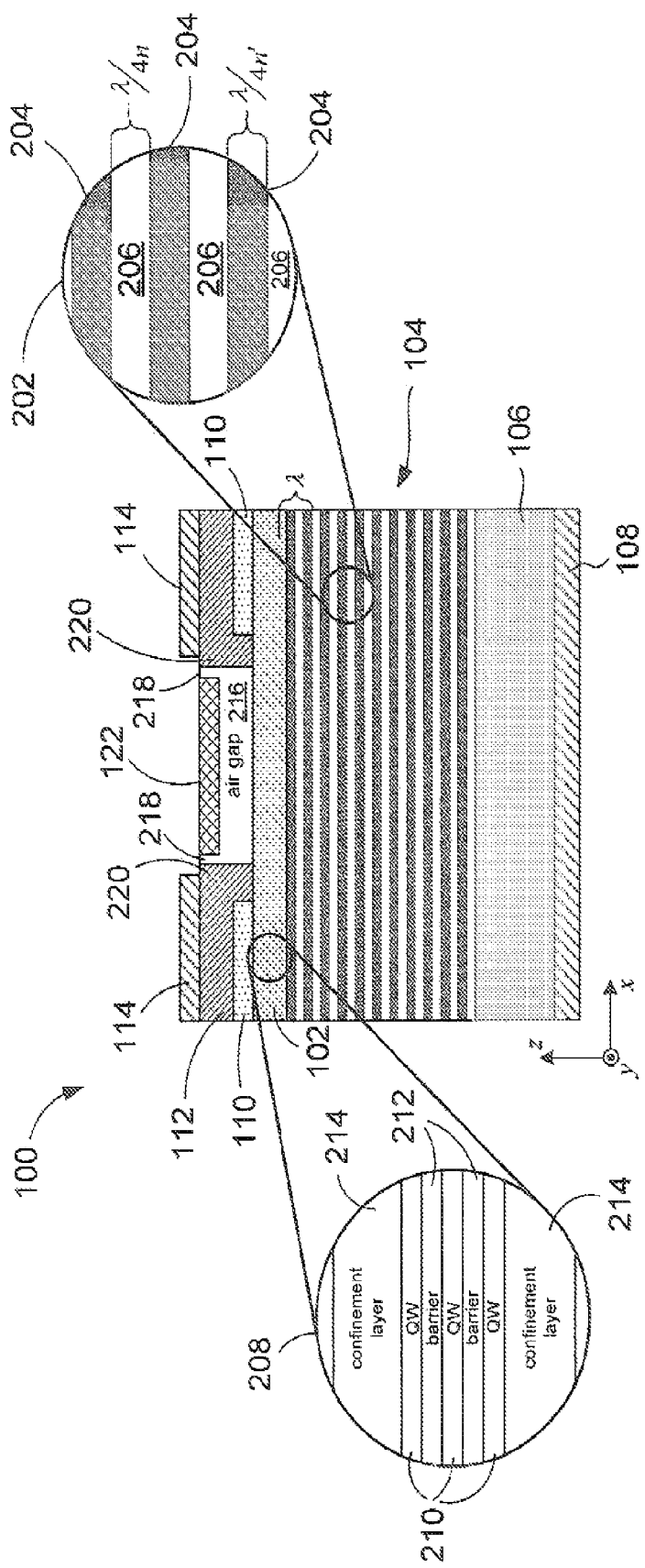
FIG. 2 shows a cross-sectional view of the VCSEL along a line A-A, shown in FIG. 1A, in accordance with one or more embodiments of the present invention.

FIG. 2 shows a cross-sectional view of the VCSEL 100 along a line A-A, shown in FIG. 1A, in accordance with one or more embodiments of the present invention. The cross-sectional view reveals the structure of the individual layers. The DBR 104 is composed of a stack of DBR pairs oriented parallel to the light-emitting layer 102. In practice, the DBR 104 can be composed of about 15 to about 40 or more DBR pairs. Enlargement 202 of a sample portion of the DBR 104 reveals that the layers of the DBR 104 each have a thickness of about $\lambda/4n$ and $\lambda/4n'$, where $\lambda$ is the desired vacuum wavelength of light emitted from the light-emitting layer 102, and n is the index of refraction of the DBR layers 206 and n' is the index of refraction of the DBR layers 204. Dark shaded layers 204 represent DBR layers composed of a first semiconductor material, and light shaded layers 206 represent DBR layers composed of a second semiconductor material with the layers 204 and 206 having different associated refractive indices. For example, layers 204 can be composed of GaAs, which has an approximate refractive index of 3.6, layers 206 can be composed AlAs, which has an approximate refractive index of 2.9, and the substrate can be composed of GaAs or AlAs.

FIG. 2 also includes an enlargement 208 of the light-emitting layer 102 that reveals one or many possible configurations for the layers comprising the light-emitting layer 102. Enlargement 208 reveals the light-emitting layer 102 is composed of three separate quantum-well layers ("QW") 210 separated by barrier layers 212. The QWs 210 are disposed between confinement layers 214. The material comprising the QWs 210 has a smaller electronic band gap than the barrier layers 212 and confinement layers 214. The thickness of the confinement layers 214 can be selected so that the overall thickness of the light-emitting layer 102 is approximately the wavelength of the light emitted from the light-emitting layer 102. The layers 210, 212, and 214 are composed of different intrinsic semiconductor materials. For example, the QW layers 210 can be composed of InGaAs (e.g., $In_{0.2}Ga_{0.8}As$), the barrier layers 212 can be composed of GaAs, and the confinement layers can be composed of GaAlAs. Embodiments of the present invention are not limited to the light-emitting layer 102 having three QWs. In other embodiments, the light-emitting layer can have one, two, or more than three QWs.

FIG. 2 also reveals the configuration of the grating layer 112. The SWG 122 is thinner that the rest of the grating layer 112 and is suspended above the light-emitting layer 112 in order to create an air gap 216 between the SWG 122 and the light-emitting layer 112. As shown in FIG. 2, and in FIG. 1B, the SWG 122 can be attached to the grating layer 112 along one edge with air gaps 218 separating the three remaining edges of the SWG 122 from the grating layer 112. The grating layer 112 and the insulating layer 110 are also configured so that portions 220 of the grating layer 112 are in contact with the light-emitting layer 102 through the opening 120 in the insulating layer 110. The insulating layer 110 constrains the flow of current through the portions 218 of the grating layer 112 to near the center of the light-emitting layer 102. The SWG 122 and the DBR 104 are the reflectors that form a reflective cavity for optical feedback during lasing of the VCSEL 100.

Non-Periodic Sub-Wavelength Gratings

As described above, the SWG 122 of the grating layer 112 is implemented as a suspended membrane above of the light-emitting layer 102. A SWG 122 configured in accordance with one or more embodiments of the present invention provides reflective functionalities including control of the shape of the wavefront of the light reflected back into the cavity of the VCSEL 100 and control of the shape of the wavefront of the light emitting through the opening 116 in the second electrode 114, shown in FIG. 1A. This can be accomplished by configuring the SWG 122 with a non-periodic grating pattern that controls the phase in the light reflected from the SWG 122 without substantially affecting the high reflectivity of the SWG 122. In certain embodiments, as described below, the SWG 122 can be configured with a grating pattern enabling the SWG 122 to be operated as a cylindrical mirror or a spherical mirror.

Figure 3A:
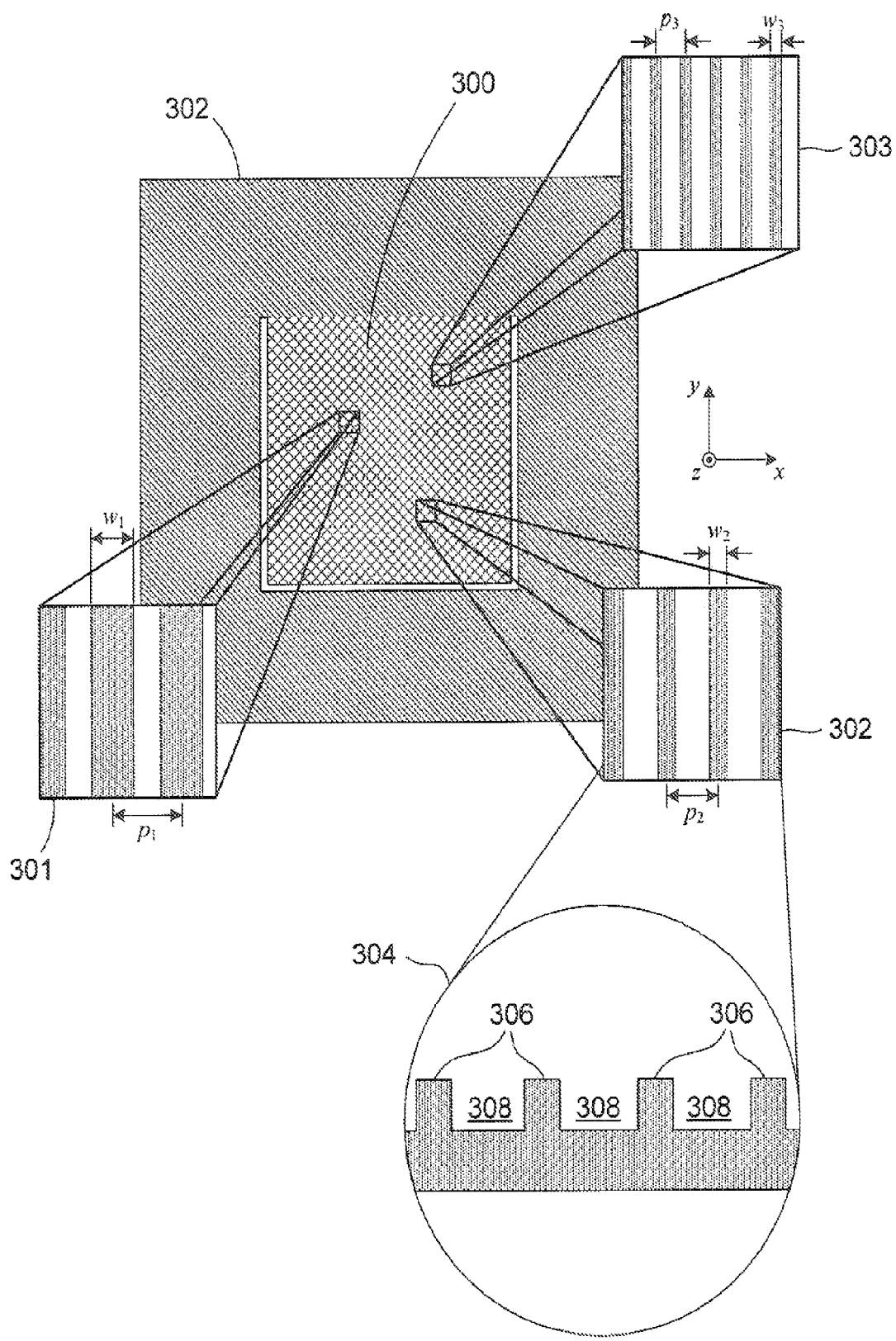
FIGS. 3A-3C show top plan views of sub-wavelength gratings configured with one-dimensional and two-dimensional grating patterns in accordance with one or more embodiments of the present invention.

FIG. 3A shows a top plan view of a SWG 300 configured with a one-dimensional grating pattern formed in a grating layer 302 in accordance with one or more embodiments of the present invention. The one-dimensional grating pattern is composed of a number of one-dimensional grating sub-patterns. In the example of FIG. 3A, three grating sub-patterns 301-303 are enlarged. In the embodiment represented in FIG. 3A, each grating sub-pattern comprises a number of regularly spaced wire-like portions of the grating layer 102 material called "lines" formed in the grating layer 302. The lines extend in the y-direction and are periodically spaced in the x-direction. In other embodiments, the line spacing can be continuously varying. FIG. 3A also includes an enlarged end-on view 304 of the grating sub-pattern 302. The lines 306 are separated by grooves 308. Each sub-pattern is characterized by a particular periodic spacing of the lines and by the line width in the x-direction. For example, the sub-pattern 301 comprises lines of width $w_1$ separated by a period $p_1$, the sub-pattern 302 comprises lines with width $w_2$ separated by a period $p_2$, and the sub-pattern 303 comprises lines with width $w_3$ separated by a period $p_3$.

The grating sub-patterns 301-303 form sub-wavelength gratings that preferentially reflect incident light polarized in one direction, i.e., the x-direction, provided the periods $p_1$, $p_2$, and $p_3$ are smaller than the wavelength of the incident light. For example, the lines widths can range from approximately 10 nm to approximately 300 nm and the periods can range from approximately 20 nm to approximately 1 μm depending on the wavelength of the incident light. The light reflected from a region acquires a phase φ determined by the line thickness t, and the duty cycle η defined as:

$$\eta = \frac{w}{p}$$

where w is the line width and p is the period spacing of the lines.

The SWGs 300 can be configured to apply a particular phase change to reflected light while maintaining a very high reflectivity. The one-dimensional SWG 300 can be configured to reflect the x-polarized component or the y-polarized component of the incident light by adjusting the period, line width and line thickness of the lines. For example, a particular period, line width and line thickness may be suitable for reflecting the x-polarized component but not for reflecting the y-polarized component; and a different period, line width and line thickness may be suitable for reflecting the y-polarized component but not for reflecting the x-polarized component.

Figure 3B:
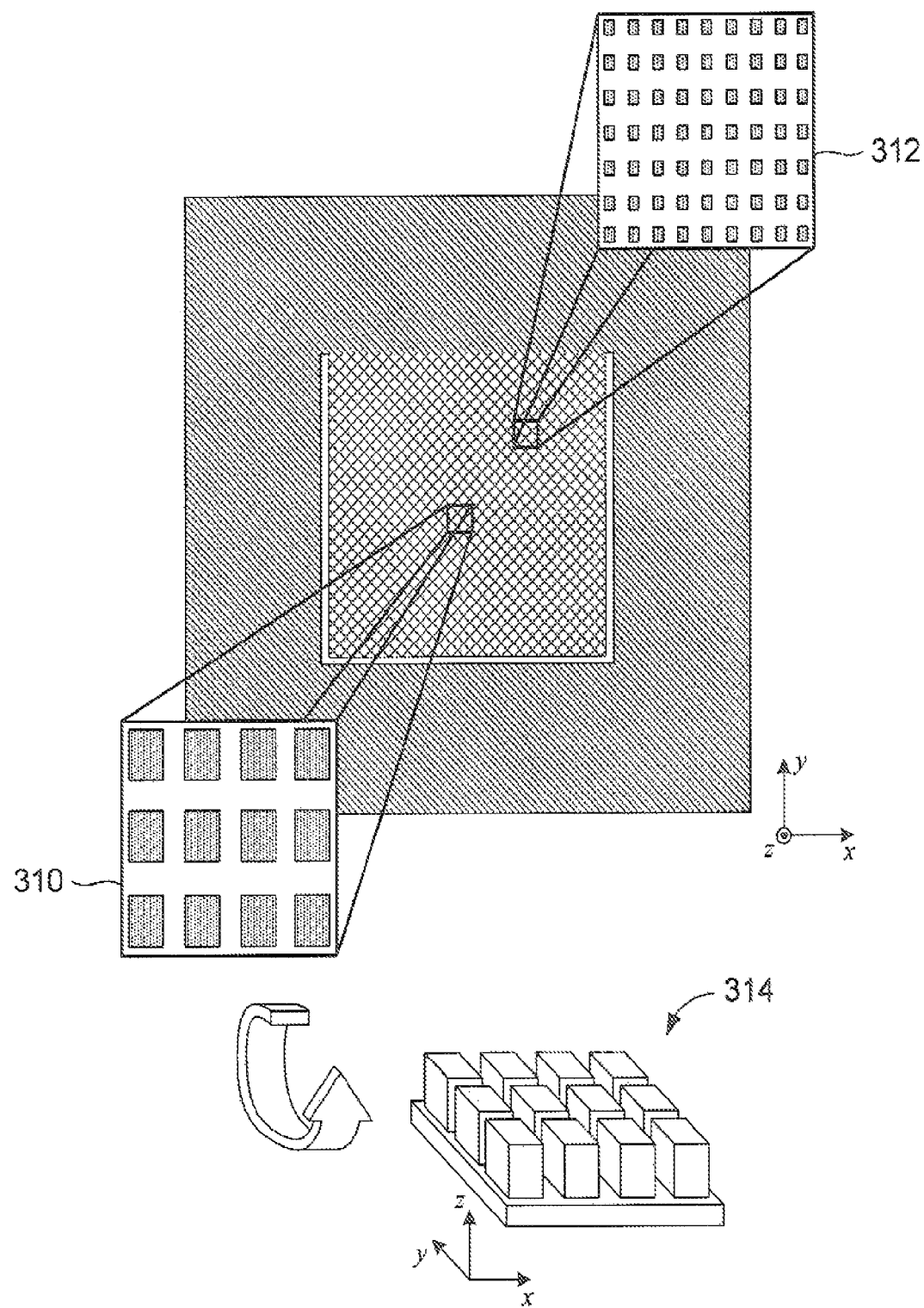
Figure 3C:
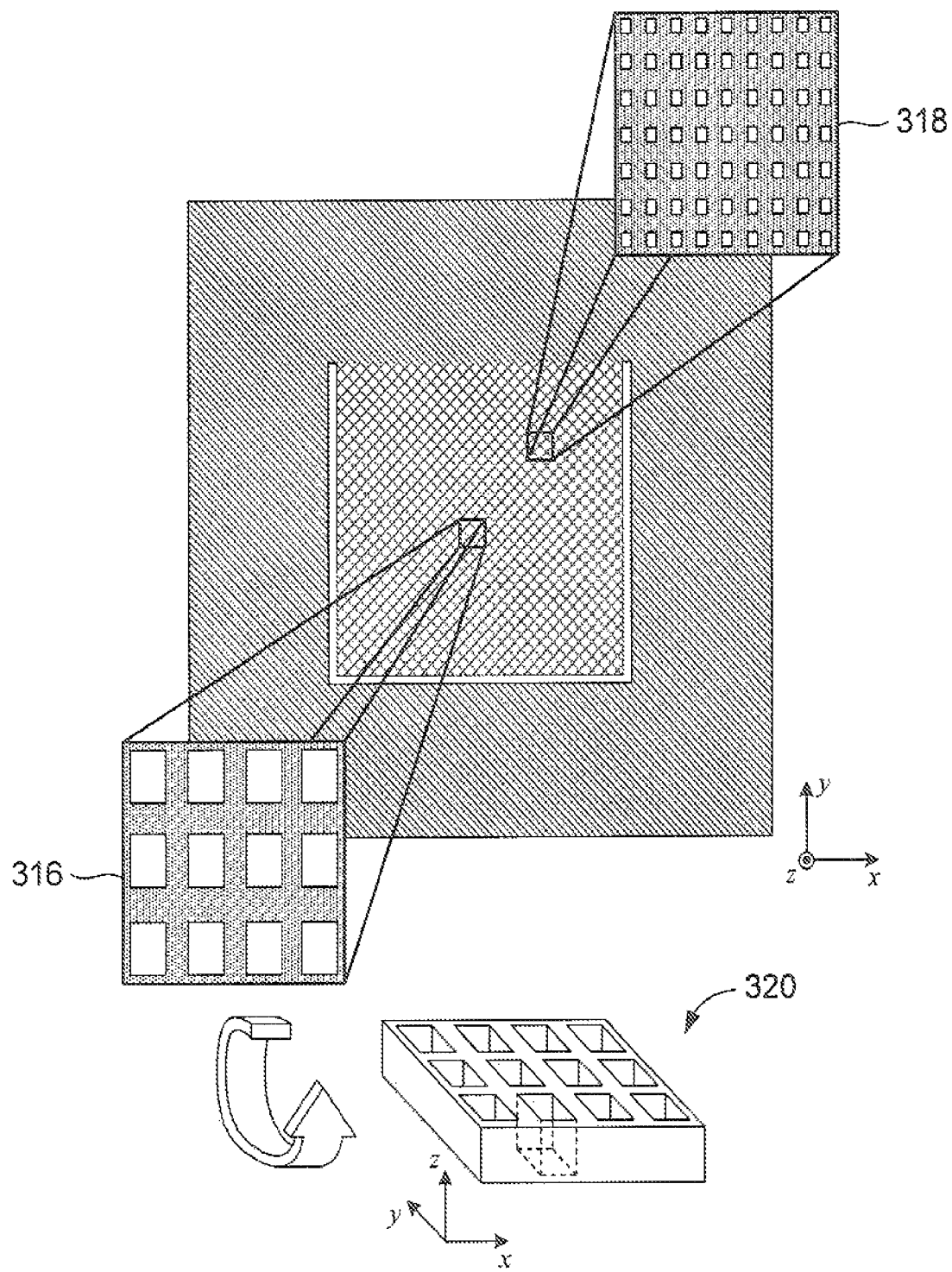

Embodiments of the present invention are not limited to one-dimensional gratings. A SWG can be configured with a two-dimensional, non-periodic grating pattern to reflect polarity insensitive light. FIGS. 3B-3C show top plan views of two example planar SWGs with two-dimensional sub-wavelength grating patterns in accordance with one or more embodiments of the present invention. In the example of FIG. 3B, the SWG is composed of posts rather lines separated by grooves. The duty cycle and period can be varied in the x- and y-directions. Enlargements 310 and 312 show two different post sizes. FIG. 3B includes an isometric view 314 of posts comprising the enlargement 310. Embodiments of the present invention are not limited to rectangular-shaped posts, in other embodiments that posts can be square, circular, elliptical or any other suitable shape. In the example of FIG. 3C, the SWG is composed of holes rather than posts. Enlargements 316 and 318 show two different rectangular-shaped hole sizes. The duty cycle can be varied in the x- and y-directions. FIG. 3C includes an isometric view 320 comprising the enlargement 316. Although the holes shown in FIG. 3C are rectangular shaped, in other embodiments, the holes can be square, circular, elliptical any other suitable shape.

In other embodiments, the line spacing, thickness, and periods can be continuously varying in both one- and two-dimensional grating patterns.

Figure 4:
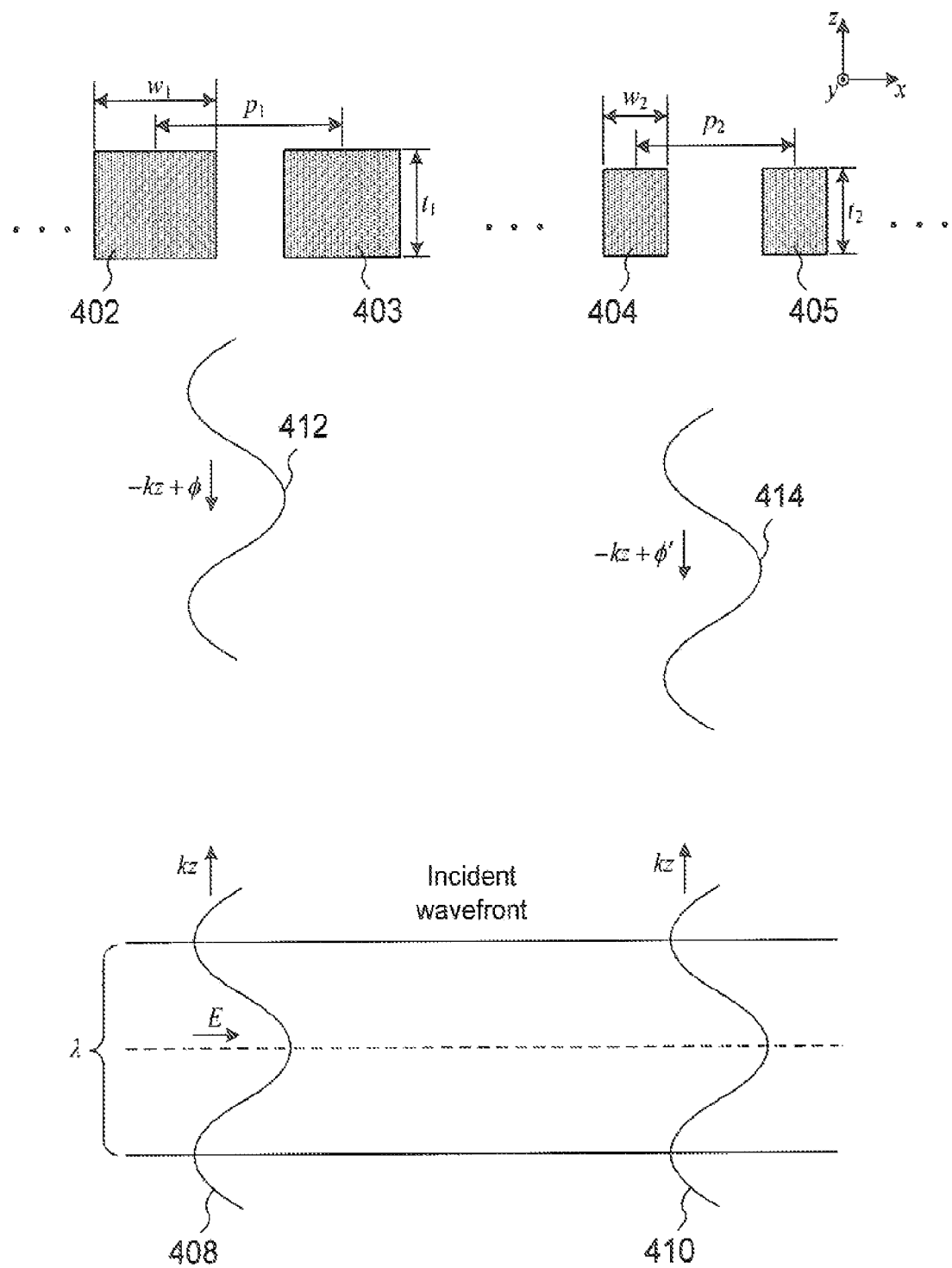
FIG. 4 shows a cross-sectional view of lines from two separate grating sub-patterns revealing the phase acquired by reflected light in accordance with one or more embodiments of the present invention.

Each of the grating sub-patterns 301-303 also reflects incident light polarized in one direction, say the x-direction, differently due to the different duty cycles and periods associated with each of the sub-patterns. FIG. 4 shows a cross-sectional view of lines from two separate grating sub-patterns revealing the phase acquired by reflected light in accordance with one or more embodiments of the present invention. For example, lines 402 and 403 can be lines in a first grating sub-pattern located in the SWG 400, and lines 404 and 405 can be lines in a second grating sub-pattern located elsewhere in the SWG 400. The thickness $t_1$ of the lines 402 and 403 is greater than the thickness $t_2$ of the lines 404 and 405, and the duty cycle $\eta_1$ associated with the lines 402 and 403 is also greater than the duty cycle $\eta_2$ associated with the lines 404 and 405. Light polarized in the x-direction and incident on the lines 402-405 becomes trapped by the lines 402 and 403 for a relatively longer period of time than the portion of the incident light trapped by the lines 404 and 405. As a result, the portion of light reflected from the lines 402 and 403 acquires a larger phase shift than the portion of light reflected from the lines 404 and 405. As shown in the example of FIG. 4, the incident waves 408 and 410 strike the lines 402-405 with approximately the same phase, but the wave 412 reflected from the lines 402 and 403 acquires a relatively larger phase shift φ than the phase φ' (i.e., φ>φ') acquired by the wave 414 reflected from the lines 404 and 405.

FIG. 5 shows a cross-sectional view of the lines 402-405 revealing how the reflected wavefront changes in accordance with one or more embodiments of the present invention. As shown in the example of FIG. 5, incident light with a substantially uniform wavefront 502 strikes the lines 402-405 producing reflected light with a curved reflected wavefront 504. The curved reflected wavefront 504 results from portions of the incident wavefront 502 interacting with the lines 402 and 403 with a relatively larger duty cycle $\eta_1$ and thickness $t_1$ than portions of the same incident wavefront 502 interacting with the lines 404 and 405 with a relatively smaller duty cycle $\eta_2$ and thickness $t_2$. The shape of the reflected wavefront 504 is consistent with the larger phase acquired by light striking the lines 402 and 403 relative to the smaller phase acquired by light striking the lines 404 and 405.

Figure 6:
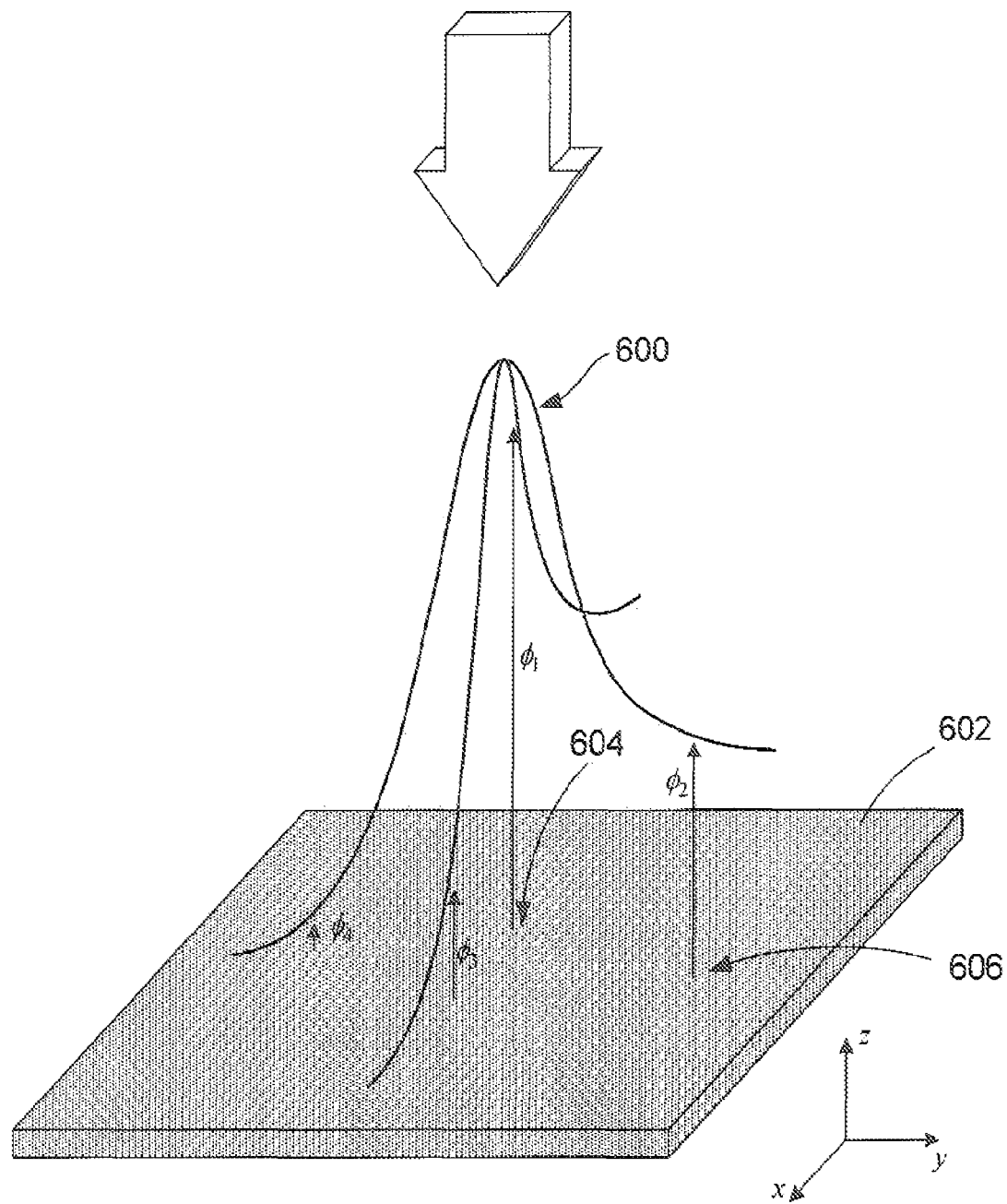
FIG. 6 shows an isometric view of an exemplary phase change contour map produced by a grating pattern configured in accordance with one or more embodiments of the present invention.

FIG. 6 shows an isometric view of an exemplary phase change contour map 600 produced by a particular grating pattern of a SWG 602 in accordance with one or more embodiments of the present invention. The contour map 600 represents the magnitude of the phase change acquired by light reflected from the SWG 602. In the example shown in FIG. 6, the grating pattern of the SWG 602 produces a contour map 602 with the largest magnitude in the phase acquired by the light reflected near the center of the SWG 602, with the magnitude of the phase acquired by reflected light decreasing away from the center of the SWG 602. For example, light reflected from a sub-pattern 604 acquires a phase of $\phi_1$, and light reflected from a sub-pattern 606 acquires a phase of $\phi_2$. Because $\phi_1$ is much larger than $\phi_2$, the light reflected from the sub-pattern 606 acquires a much larger phase than the light reflected from the sub-pattern 608.

The phase change in turn shapes the wavefront of light reflected from the SWG. For example, as described above with reference to FIGS. 4 and 5, lines having a relatively larger duty cycle produce a larger phase shift in reflected light than lines having a relatively smaller duty cycle. As a result, a first portion of a wavefront reflected from lines having a first duty cycle lags behind a second portion of the same wavefront reflected from a different set of lines configured with a second relatively smaller duty cycle. Embodiments of the present invention include patterning the SWG to control the phase change and ultimately the shape of the reflected wavefront so that the SWG can be operated as a mirror with particular optical properties, such as a focusing mirror or even a diverging mirror.

Figure 7:
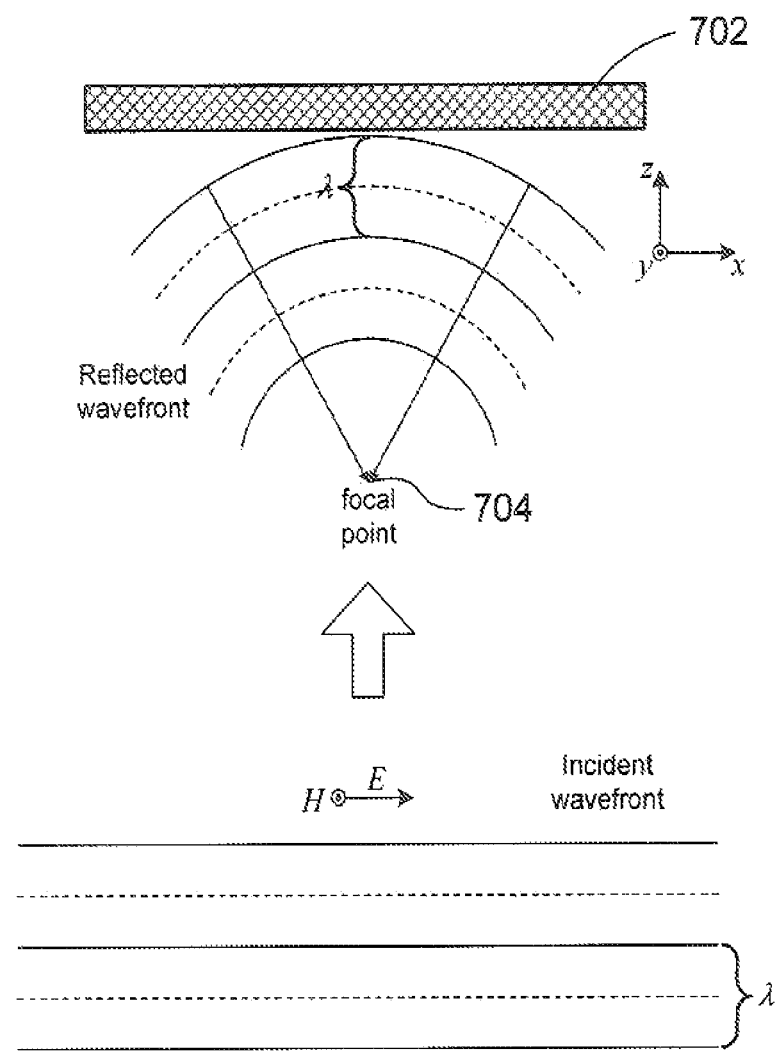
FIG. 7 shows a side view of a sub-wavelength grating configured to focus incident light to a focal point in accordance with one or more embodiments of the present invention.

FIG. 7 shows a side view of a SWG 702 configured to operate as a focusing mirror in accordance with one or more embodiments of the present invention.

In the example of FIG. 7, the SWG 702 is configured with a grating pattern so that incident light polarized in the x-direction is reflected with a wavefront corresponding to focusing the reflected light at the focal point 704.

Configuring Non-Periodic Sub-Wavelength Gratings

Figure 8:
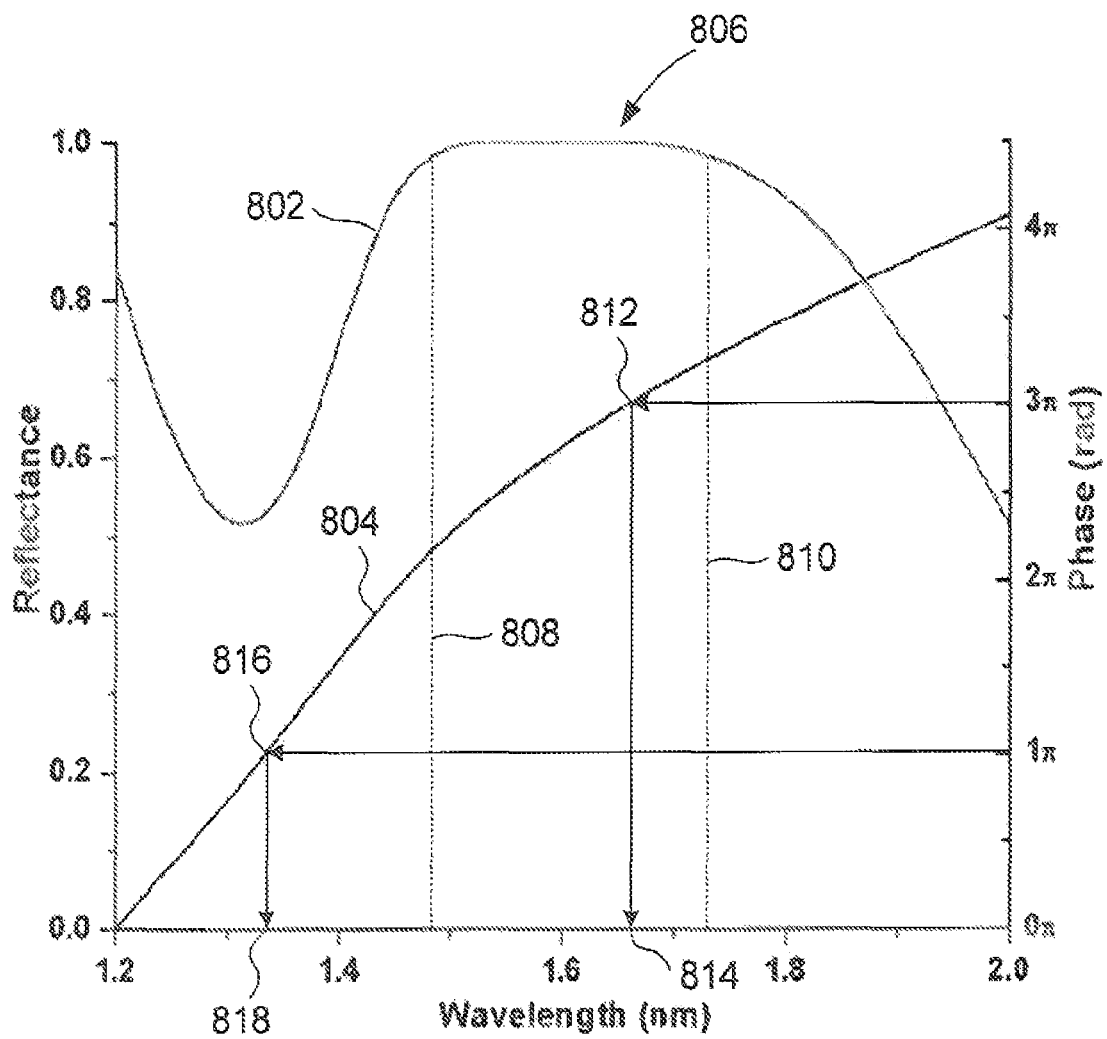
FIG. 8 shows a plot of reflectance and phase shift over a range of incident light wavelengths for a sub-wavelength grating configured in accordance with one or more embodiments of the present invention.

Embodiments of the present invention include a number of ways in which a SWG can be configured to operate as a mirror that introduces a desired shape to the wavefront of the light reflected from the SWG. A first method configuring a SWG to reflect with a desired wavefront includes determining a reflection coefficient profile for the grating layer of a SWG. The reflection coefficient is a complex valued function represented by:

$$r(\lambda) = \sqrt{R(\lambda)} e^{i\phi(\lambda)}$$

where $R(\lambda)$ is the reflectance of the SWG, and $\phi(\lambda)$ is the phase shift or phase change produced by the SWG. FIG. 8 shows a plot of reflectance and phase shift over a range of incident light wavelengths for an example SWG in accordance with one or more embodiments of the present invention. In this example, the grating layer is configured with a one-dimensional grating and is operated at normal incidence with the electric field component polarized perpendicular to the lines of the grating layer. In the example of FIG. 8, curve 802 corresponds to the reflectance $R(\lambda)$ and curve 804 corresponds to the phase shift $\phi(\lambda)$ produced by the SWG for the incident light over the wavelength range of approximately 1.2 μm to approximately 2.0 μm. The reflectance and phase curves 802 and 804 can be determined using either the well-known finite element method or rigorous coupled wave analysis. Due to the strong refractive index contrast SWG and air, the SWG has a broad spectral region of high reflectivity 806. However, curve 804 reveals that the phase of the reflected light varies across the entire high-reflectivity spectral region between dashed-lines 808 and 810.

When the spatial dimensions of the period and width of the lines is changed uniformly by a factor α, the reflection coefficient profile remains substantially unchanged, but with the wavelength axis scaled by the factor a. In other words, when a grating has been designed with a particular reflection coefficient $R_0$ at a free space wavelength $\lambda_0$, a new grating with the same reflection coefficient at a different wavelength λ can be designed by multiplying all the grating geometric parameters, such as the period, line thickness, and line width, by the factor $\alpha = \lambda/\lambda_0$, giving $r(\lambda) = r_0(\lambda/\alpha) = r_0(\lambda_0)$.

In addition, a grating can be designed with $|R(\lambda)| \rightarrow 1$, but with a spatially varying phase, by scaling the parameters of the original periodic grating non-uniformly within the high-reflectivity spectral window 806. Suppose that introducing a phase $\phi(x, y)$ on a portion of light reflected from a point on the SWG with transverse coordinates (x, y) is desired. Near the point (x, y), a non-uniform grating with a slowly varying grating scale factor α(x, y) behaves locally as though the grating was a periodic grating with a reflection coefficient $R_0(\lambda/\alpha)$. Thus, given a periodic grating design with a phase $\phi_0$ at some wavelength $\lambda_0$, choosing a local scale factor α(x, y)=$\lambda/\lambda_0$ gives $\phi(x, y) = \phi_0$ at the operating wavelength λ. For example, suppose that introducing a phase of approximately 3π on a portion of the light reflected from a point (x, y) on a SWG design is desired, but the line width and period selected for the point (x, y) introduces a phase of approximately π. Referring again to the plot in FIG. 8, the desired phase $\phi_0 = 3\pi$ corresponds to the point 812 on the curve 804 and the wavelength $\lambda_0$ 32 1.67 μm 814, and the phase π associated with the point (x, y) corresponds to the point 816 on the curve 804 and the wavelength λ=1.34 μm. Thus the scale factor is α(x, y)=$\lambda/\lambda_0$=1.34/1.67=0.802, and the line width and period at the point (x, y) can be adjusted by multiplying by the factor α in order to obtain the desired phase $\phi_0 = 3\pi$ at the operating wavelength λ32 1.34 μm.

Figure 9:
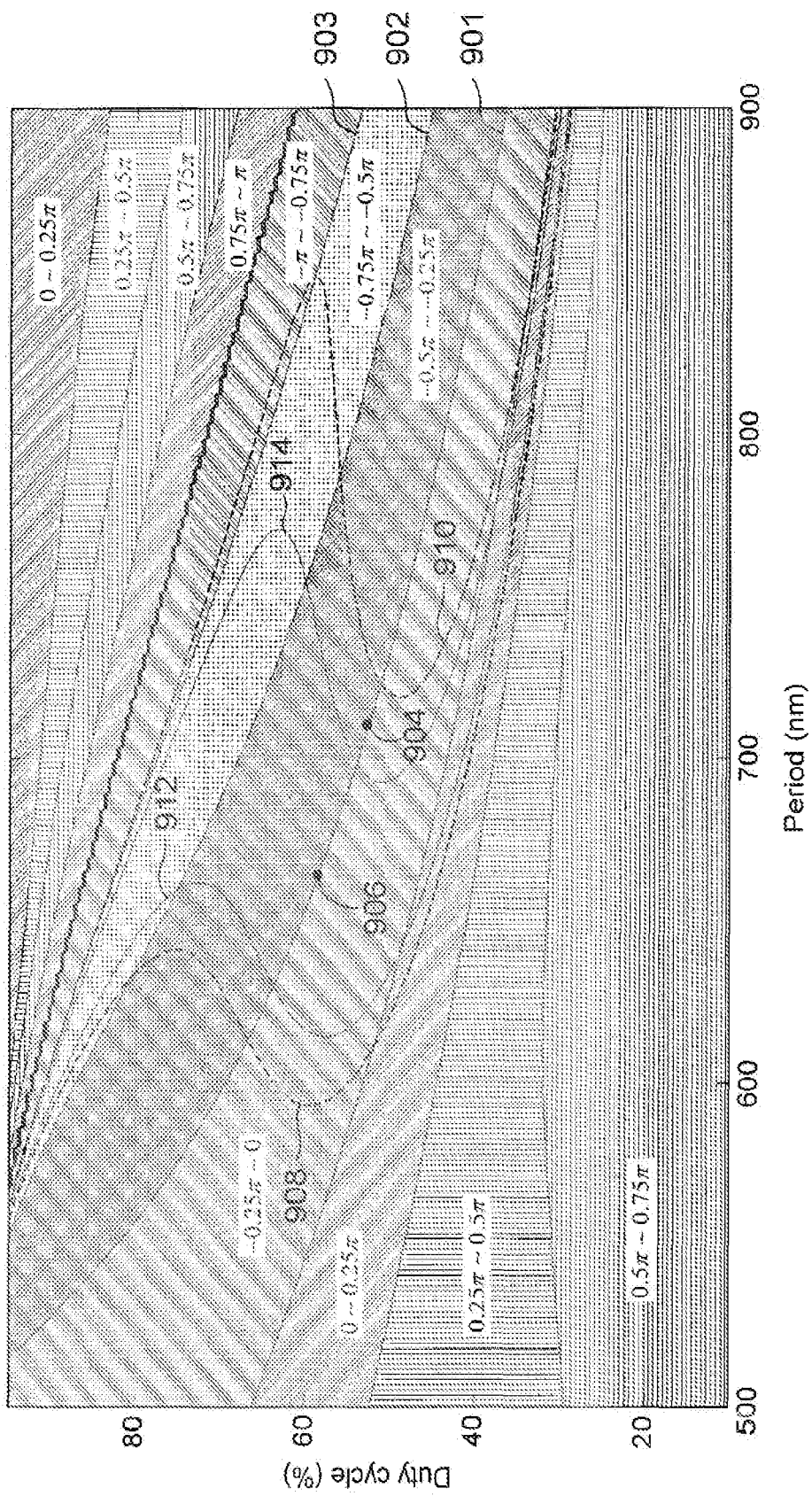
FIG. 9 shows a phase contour plot of phase variation as a function of period and duty cycle obtained in accordance with one or more embodiments of the present invention.

The plot of reflectance and phase shift versus a range of wavelengths shown in FIG. 8 represents one way in which parameters of a SWG, such as line width, line thickness and period, can be determined in order to introduce a particular phase to light reflected from a particular point of the SWG. In other embodiments, phase variation as a function of period and duty cycle can be used to construct a SWG. FIG. 9 shows a phase contour plot of phase variation as a function of period and duty cycle that can be used to configure a SWG in accordance with one or more embodiments of the present invention. The contour plot shown in FIG. 9 can be produced using either the well-known finite element method or rigorous coupled wave analysis. Contour lines, such as contour lines 901-903, each correspond to a particular phase acquired by light reflected from a grating pattern with a period and duty cycle lying anywhere along the contour. The phase contours are separated by $0.25\pi$ rad. For example, contour 901 corresponds periods and duty cycles that apply a phase of $-0.25\pi$ rad to reflected light, and contour 902 corresponds to periods and duty cycles that apply a phase of $-0.5\pi$ rad to reflected light. Phases between $-0.25\pi$ rad and $-0.5\pi$ rad are applied to light reflected from a SWG with periods and duty cycles that lie between contours 901 and 902. A first point (p, η) 904, corresponding to a grating period of 700 nm and 54% duty cycle, and a second point (p, η) 906, corresponding to a grating period of 660 nm and 60% duty cycle, both lie on the contour 901 and produce the same phase shift $-0.25\pi$ but with different duty cycles and line period spacing.

FIG. 9 also includes two reflectivity contours for 95% and 98% reflectivity overlain on the phase contour surface. Dashed-line contours 908 and 910 correspond to 95% reflectivity, and solid line contours 912 and 914 correspond to 98% reflectivity. Points (p, η, φ) that lie anywhere between the contours 908 and 910 have a minimum reflectivity of 95%, and points (p, η, φ) that lie anywhere between the contours 912 and 914 have a minimum reflectivity of 98%.

The points (p, η, φ) represented by the phase contour plot can be used to select periods and duty cycles for a grating that can be operated as a particular type of mirror with a minimum reflectivity, as described below in the next subsection. In other words, the data represented in the phase contour plot of FIG. 9 can be used to design SWG optical devices. In certain embodiments, the period or duty cycle can be fixed while the other parameter is varied to design and fabricate SWGs. In other embodiments, both the period and duty cycle can be varied to design and fabricate SWGs.

Figure 10A:
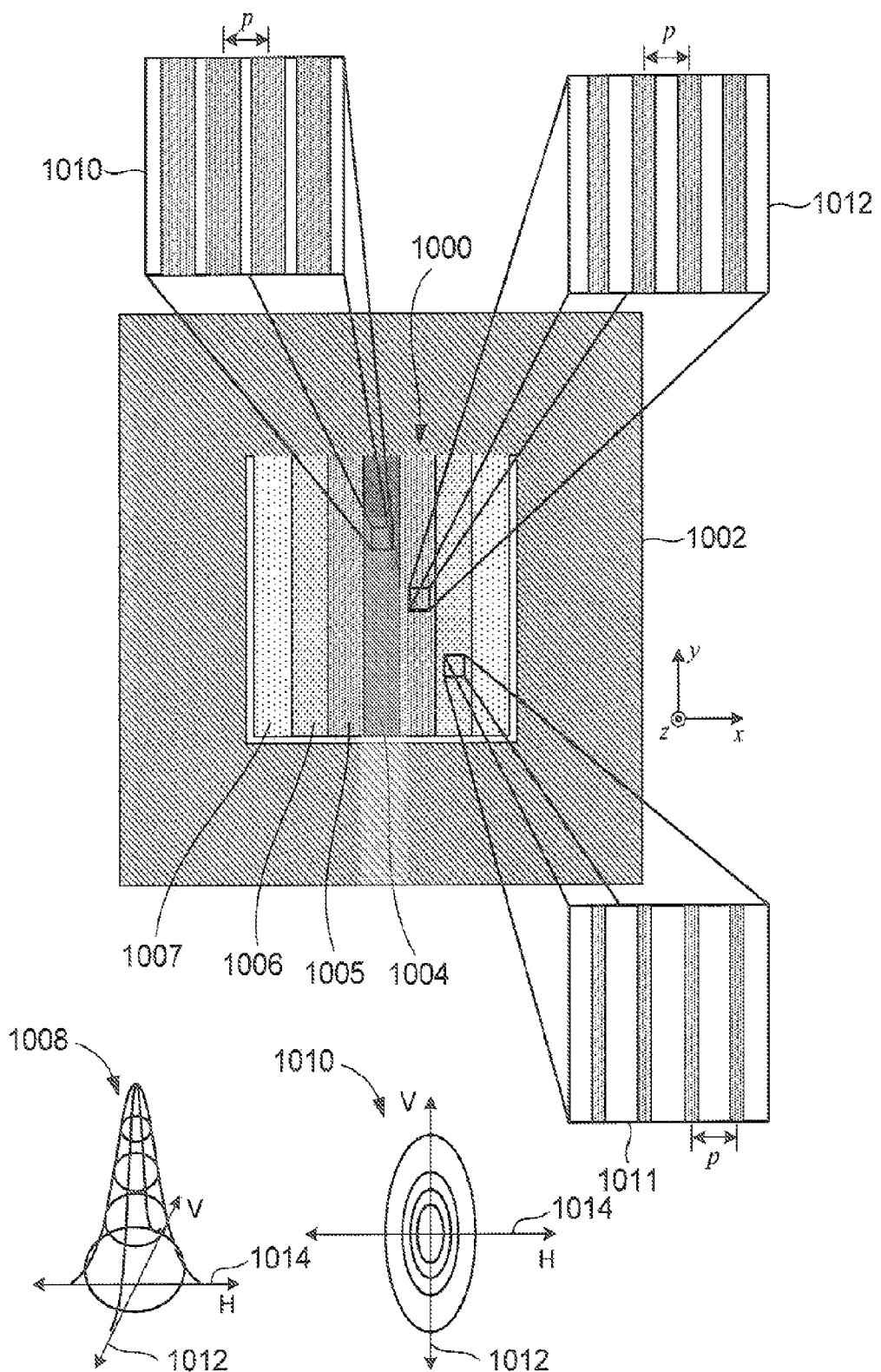
FIG. 10A shows a top plan view of a one-dimensional sub-wavelength grating configured to operate as a focusing cylindrical mirror in accordance with one or more embodiments of the present invention.

In certain embodiments, the SWG can be configured to operate as a cylindrical mirror with a constant period and variable duty cycle. FIG. 10A shows a top plan view of a one-dimensional SWG 1000 formed in a grating layer 1002 and configured to operate as a focusing cylindrical mirror for incident light polarized parallel to the x-direction in accordance with one or more embodiments of the present invention. FIG. 10A includes shaded regions, such as shaded regions 1004-1007, each shaded region representing a different duty cycle with darker shaded regions, such as region 1004, representing regions with a relatively larger duty cycle than lighter shaded regions, such as region 1007. FIG. 10A also includes enlargements 1010-1012 of sub-regions revealing that the lines are parallel in the y-direction and the line period spacing p is constant or fixed in the x-direction. Enlargements 1010-1012 also reveal that the duty cycle η decreases away from the center. The SWG 1000 is configured to focus reflected light polarized in the x-direction to a focal point, as described above with reference to FIG. 7A. FIG. 10A also includes example isometric and top view contour plots 1008 and 1010 of reflected beam profiles at the foci. V-axis 1012 is parallel to the y-direction and represents the vertical component of the reflected beam, and H-axis 1014 is parallel to the x-direction and represents the horizontal component of the reflected beam. The reflected beam profiles 1008 and 1010 indicate that for incident light polarized in the x-direction, the SWG 1000 reflects a Gaussian-shaped beam that is narrow in the direction perpendicular to the lines (the "H" of x-direction) and broad in the direction parallel to the lines (the "V" or y-direction).

Figure 10B:
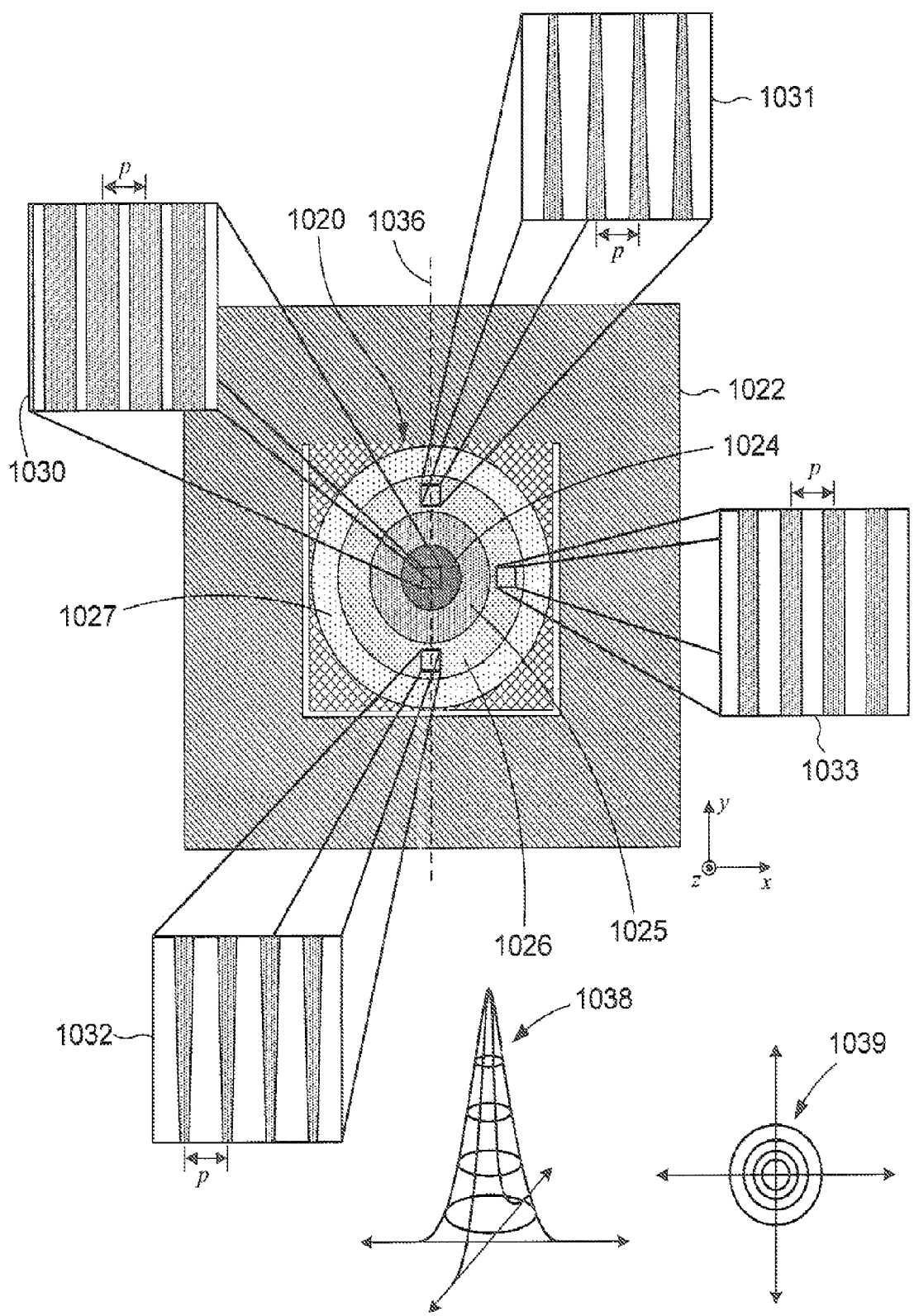
FIG. 10B shows a top plan view of a one-dimensional sub-wavelength grating configured to operate as a focusing spherical mirror in accordance with one or more embodiments of the present invention.

In certain embodiments, a SWG with a constant period can be configured to operate as a spherical mirror for incident polarized light by tapering the lines of the grating layer away from the center of the SWG. FIG. 10B shows a top plan view of a one-dimensional SWG 1020 formed in a grating layer 1022 and configured to operate as a focusing spherical mirror for incident light polarized in the x-direction in accordance with one or more embodiments of the present invention. The SWG 1020 defines a circular mirror aperture. The grating pattern of the SWG 1020 is represented by annular shaded regions 1024-1027. Each shaded annular region represents a different grating sub-pattern of lines. Enlargements 1030-1033 reveal that the lines are tapered in the y-direction with a constant line period spacing p in the x-direction. In particular, enlargements 1030-1032 are enlargements of the same lines running parallel to dashed-reference line 1036 in the y-direction. Enlargements 1030-1032 show that the period p is fixed. Each annular region has the same duty cycle η. For example, enlargements 1031-1033 comprise portions of different lines within the annular region 1026 that have substantially the same duty cycle. As a result, each portion of an annular region imparts the same approximate phase shift in the light reflected from the annular region. For example, light reflected from anywhere within the annular region 1026 acquires substantially the same phase shift φ. FIG. 10B also includes example isometric and top view contour plots 1038 and 1039 of reflected beam profiles at the foci. The beam profiles 1038 and 1039 reveal that the spherical SWG 1020 produces a symmetrical Gaussian-shaped reflected beam and is narrower in the V- or x-direction than the reflected beam of the SWG 1000.

The SWGs 1000 and 1020 represent just two or many different kinds of SWGs that can be configured in accordance with one or more embodiments of the present invention.

Laser Operation and Cavity Configurations

FIGS. 11A-11B show cross-sectional views of the resonant cavity of the VCSEL 100 operated in accordance with one or more embodiments of the present invention. As shown in FIG. 11A, the electrodes 114 and 108 are coupled to a voltage source 1102 used to electronically pump the light-emitting layer 102. FIG. 11A includes an enlargement 1104 of a portion of a SWG 122, the air gap 216, a portion of the light-emitting layer 102, and a portion of the DBR 104. When no bias is applied to the VCSEL 100, the QWs 210 have a relatively low concentration of electrons in corresponding conduction bands and a relatively low concentration of vacant electronic states, or holes, in corresponding valence bands and substantially no light is emitted from the light-emitting layer 102. On the other hand, when a forward-bias is applied across the layers of the VCSEL array 100, electrons are injected into the conduction bands of the QWs 210 while holes are injected into the valence bands of the QWs 210, creating excess conduction band electrons and excess valence band holes in a process called population inversion. The electrons in the conduction band spontaneously recombine with holes in the valence band in a radiative process called "electron-hole recombination" or "recombination." When electrons and holes recombine, light is initially emitted in all directions over a range of wavelengths. As long as an appropriate operating voltage is applied in the forward-bias direction, electron and hole population inversion is maintained at the QWs 210 and electrons can spontaneously recombine with holes, emitting light in nearly all directions.

As described above, the SWG 122 and the DBR 104 can be configured to form a cavity that reflects light emitted substantially normal to the light-emitting layer 102 and over a narrow range of wavelengths back into the light-emitting layer 102, as indicated by directional arrows 1108. The light reflected back into the QWs 210 stimulates the emission of more light from the QWs 210 in a chain reaction. Note that although the light-emitting layer 102 initially emits light over a range of wavelengths via spontaneous emission, the SWG 122 is configured to select a wavelength, $\lambda$, to reflect back into the light-emitting layer 102 causing stimulated emission. This wavelength is referred to as the longitudinal, axial, or z-axis mode. Over time, the gain in the light-emitting layer 102 becomes saturated by the longitudinal mode and the longitudinal mode begins to dominate the light emissions from the light-emitting layer 102 and other longitudinal modes decay. In other words, light that is not reflected back and forth between the SWG 122 and the DBR 104 leaks out of the VCSEL array 100 with no appreciable amplification and eventually decays as the longitudinal mode supported by the cavity begins to dominate. The dominant longitudinal mode reflected between the SWG 122 and the DBR 104 is amplified as it sweeps back and forth across the light-emitting layer 102 producing standing waves 1108 that terminate within the SWG 122 and extend into the DBR 104, as shown in FIG. 11B. Ultimately, a substantially coherent beam of light 1110 with the wavelength $\lambda$ emerges from the SWG 122. Light emitted from the light-emitting layer 102 penetrates the DBR 104 and the SWG 122 and adds a contribution to the round trip phase of the light in the cavity. The DBR 104 and the SWG 122 can be thought of as perfect mirrors that shift in space to provide an effective extra phase shift.

The cavity created by the DBR 104 and the SWG 122 can be configured to support a single longitudinal or z-axis cavity mode with a particular wavelength $\lambda'$. For example, returning to FIG. 8, the high reflectivity portion 806 of the reflectance curve 802 represents a narrow band of wavelengths that can be reflected by the SWG 122. FIG. 12 shows an example plot 1202 of an intensity or gain profile 1204 of light emitted from the light-emitting layer 102 centered about a wavelength $\lambda$ and an example plot 1206 of a single hypothetical cavity mode in accordance with one or more embodiments of the present invention. The peak 1208 in the plot 1206 is associated with a single longitudinal cavity mode $\lambda'$ supported by the cavity formed by the SWG 122 and the DBR 104. The light-emitting layer 102 makes available a range of wavelengths represented by the intensity profile 1204 out of which the cavity selects the longitudinal mode with the wavelength, $\lambda'$, represented by peak 1210, which is amplified within the cavity and emitted from the VCSEL 100.

Figure 13:
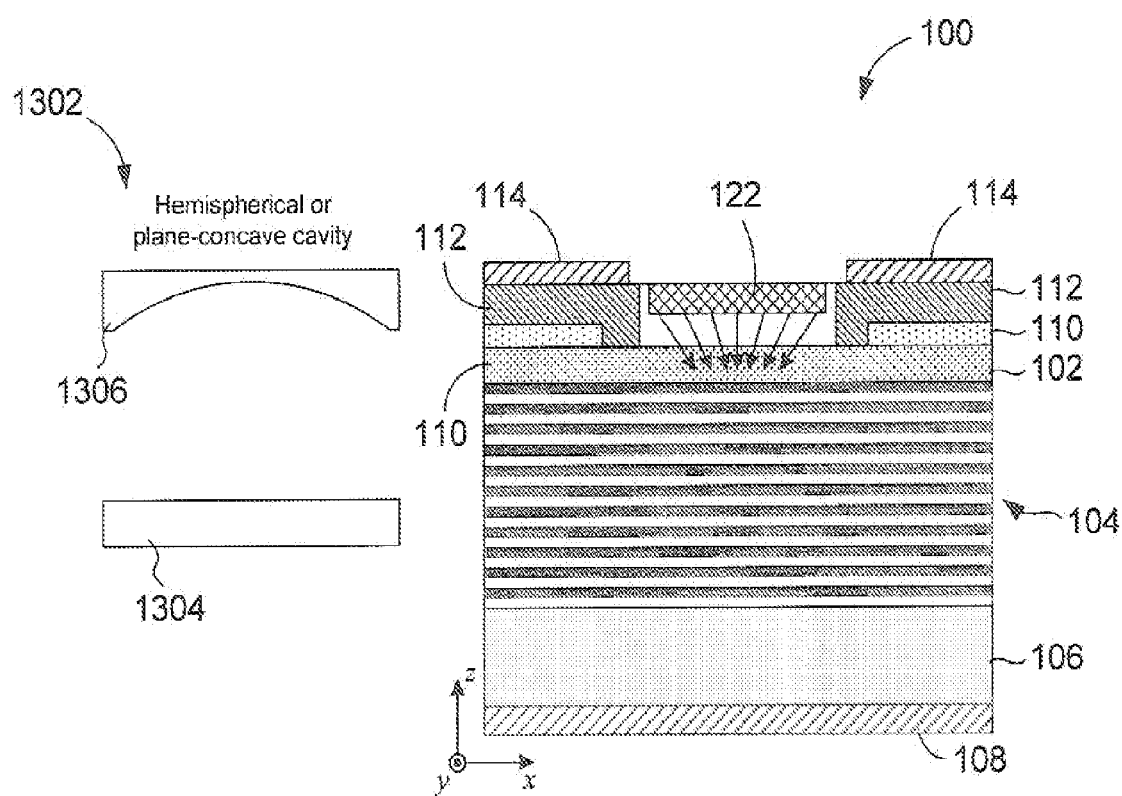
FIG. 13 shows a plane-concave resonator that schematically represents the resonant cavity of a VCSEL configured in accordance with one or more embodiments of the present invention.

As described above in the preceding subsection Configuring Non-periodic Sub-wavelength Gratings, the SWG 122 can be configured to shape the internal longitudinal or z-axis cavity modes and operate as a concave mirror. FIG. 13 shows a plane-concave resonator 1302 that schematically represents a configuration of the resonant cavity of the VCSEL 100 in accordance with one or more embodiments of the present invention. The plane-concave resonator 1302 includes a planar mirror 1304 and a concave mirror 1306. The DBR 104 of the VCSEL 100 corresponds to the planar mirror 1304, and the SWG 122 can be configured as described above to operate as a concave mirror that reflects light so that the light is concentrated within a region of the light-emitting layer 102 between the SWG 122 and the DBR 104. For example, the SWG 122 can be configured to reflect light with the intensity profiles represented in FIGS. 10A and 10B.

The VCSEL 100 can be configured to emit polarized cavity modes. As described above in the preceding subsection Configuring Non-periodic Sub-wavelength Gratings, the SWG 122 can be configured to reflect light polarized substantially perpendicular to the lines. In other words, the SWG 122 of the resonant cavity also selects the component of the light emitted from the light-emitting layer 102 that is polarized either perpendicular or parallel to the lines of the SWG 122. The polarization component of the light emitted from the light-emitting layer 102 is selected by the SWG 122 and reflected back into the cavity. As the gain becomes saturated, only modes with the polarization selected by the SWG 122 are amplified. The components of the light emitted from the light-emitting layer that are not polarized perpendicular to the lines of the SWG 122 leak out of the VCSEL 100 with no appreciable amplification. In other words, modes with polarizations other than those selected by the SWG 122 decay and are not present in the emitted beam. Ultimately, only modes polarized in the direction selected by the SWG 122 are emitted from the VCSEL 100.

Figure 14:
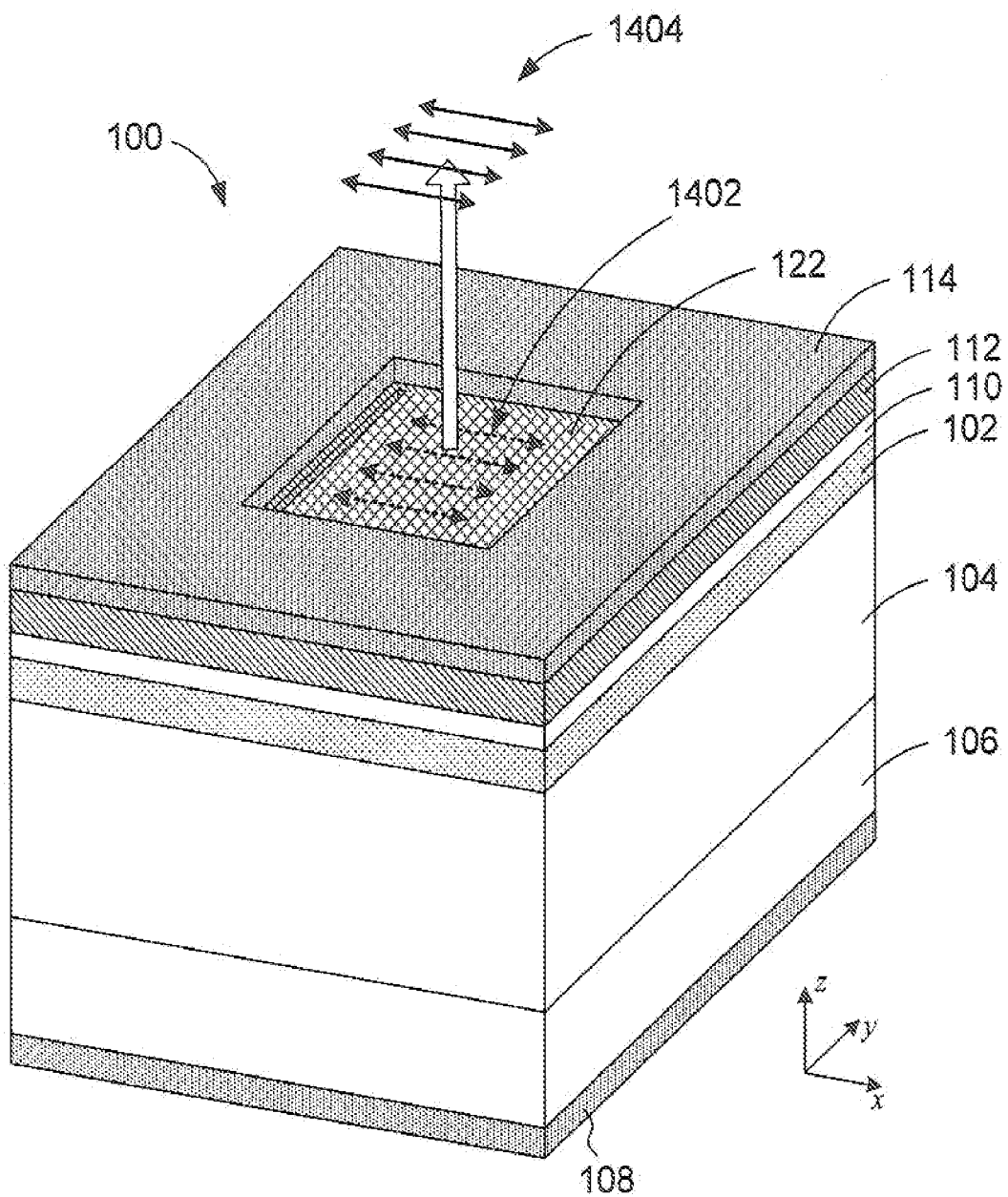
FIG. 14 shows polarized light emitted from a VCSEL configured in accordance with one or more embodiments of the present invention.

FIG. 14 shows an example of polarized light emitted from the VCSEL 100 in accordance with one or more embodiments of the present invention. Light emitted from the light-emitting layer 102 is unpolarized. However, over time, as the gain saturates, a polarization state is selected by the SWG 122. Double-headed arrows 1402 incident on the SWG 122 from within the VCSEL 100 represent a polarization state selected by the SWG 122 light. SWG 122 can be configured as described above with lines and grooves running parallel to the y-direction. In the example of FIG. 14, the SWG 122 selects only the component of the light emitted from the light-emitting layer 102 that is polarized in the x-direction. The polarized light is amplified within the cavity formed by the SWG 122 and the DBR 104 as described above with reference to FIG. 12. As shown in the example of FIG. 14, the light emitted from VCSEL 100 is polarized in the x-direction, as represented by double-headed arrows 1404.

In addition to supporting particular longitudinal or axial modes of oscillation, which correspond to standing waves supported by the cavity along the z-axis, transverse modes can be supported as well. Transverse modes are normal to the cavity or z-axis and are known as $TEM_{nm}$ modes, where m and n subscripts are the integer number of transverse nodal lines in the x- and y-directions across the emerging beam. In other words, the beam formed within the cavity can be segmented in its cross section into one or more regions. A SWG can be configured to only support one or certain transverse modes.

Figure 15A:
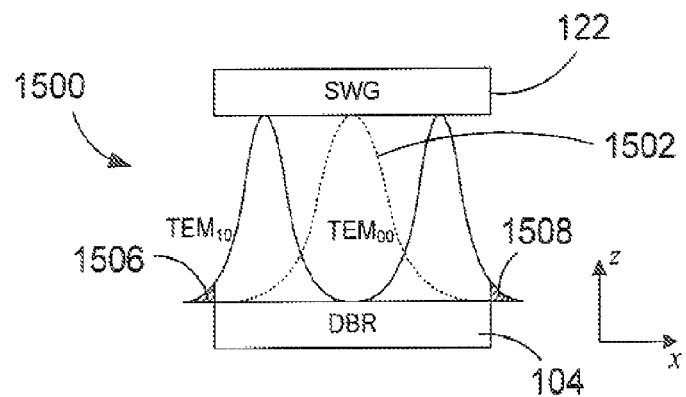
FIG. 15A shows an example of two transverse modes created in a cavity of a VCSEL configured in accordance with one or more embodiments of the present invention.

FIG. 15A shows an example of two transverse modes created in a cavity 1502 formed by the SWG 122 and the DBR 104 in accordance with one or more embodiments of the present invention. As described above, the SWG 122 can be configured to define the size of the cavity. As shown in FIG. 15A, the $TEM_{00}$ mode, is represented by dotted curve 1502 and the $TEM_{10}$ mode is represented by solid curve 1504. The $TEM_{00}$ mode has no nodes and lies entirely within the cavity 1500. On the other hand, the $TEM_{10}$ mode has one node along the x-direction and portions 1506 and 1508 lie outside the cavity 1500. As a result, during gain saturation, because the $TEM_{00}$ modes lies entirely within the cavity 1500, $TEM_{00}$ mode is amplified. However, because portions of the $TEM_{10}$ mode lie outside the cavity 1500, the $TEM_{10}$ mode decreases during gain saturation and eventually decays, while the TEM$_{00}$ mode continues to amplify. Other TEM$_{mn}$ modes that cannot be supported by, or lie entirely within, the cavity 1500 also decay.

Figure 15B:
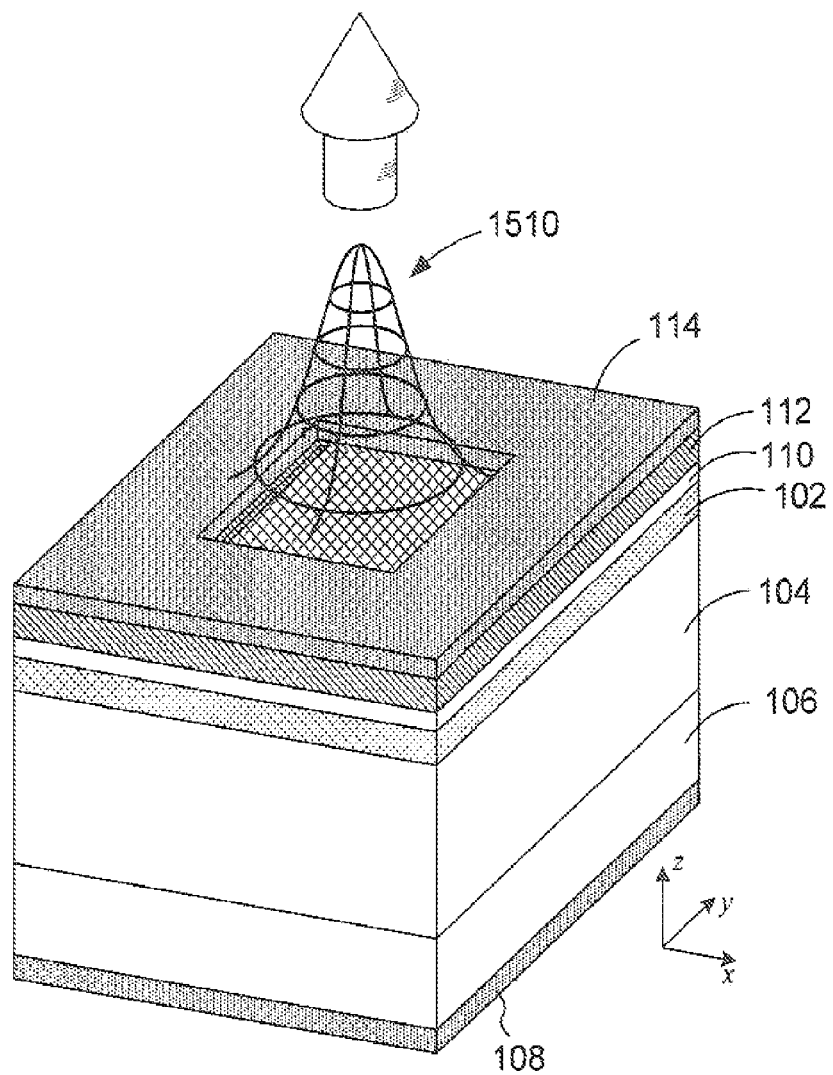
FIG. 15B shows an example contour plot of an intensity profile distribution of the lowest order transverse mode emitted from a VCSEL configured in accordance with one or more embodiments of the present invention.

FIG. 15B shows a contour plot 1510 of the intensity profile distribution of TEM$_{00}$ emitted from the VCSEL 100 in accordance with one or more embodiments of the present invention. In the embodiment represented in FIG. 15B, the TEM$_{00}$ emerges from the SWG 122 with a nearly planar coherent wavefront and with a Gaussian transverse irradiance profile represented by the contour plot 1510. The intensity profile is symmetrical about the z-axis. The external TEM$_{00}$ mode corresponds to an internal TEM mode produced by the SWG 122 configured to operate as a spherical mirror as described above with reference to FIG. 10B. In other embodiments, the SWG 122 can be configured to operate as a cylindrical mirror that produces a lowest order transverse mode TEM$_{00}$ that is narrow in the direction perpendicular to the lines of the SWG 122 (the x-direction) and broad in the direction parallel to the lines of the SWG 122 (the y-direction), as described above with reference to FIG. 10A. The TEM00 mode can be coupled into the core of an optical fiber by placing the fiber so that core of the fiber is located in close proximity to the SWG 122. The SWG 122 can also be configured to emit transverse modes that are suitable for coupling into hollow waveguides, such as the EH$_{11}$ mode.

Figure 16:
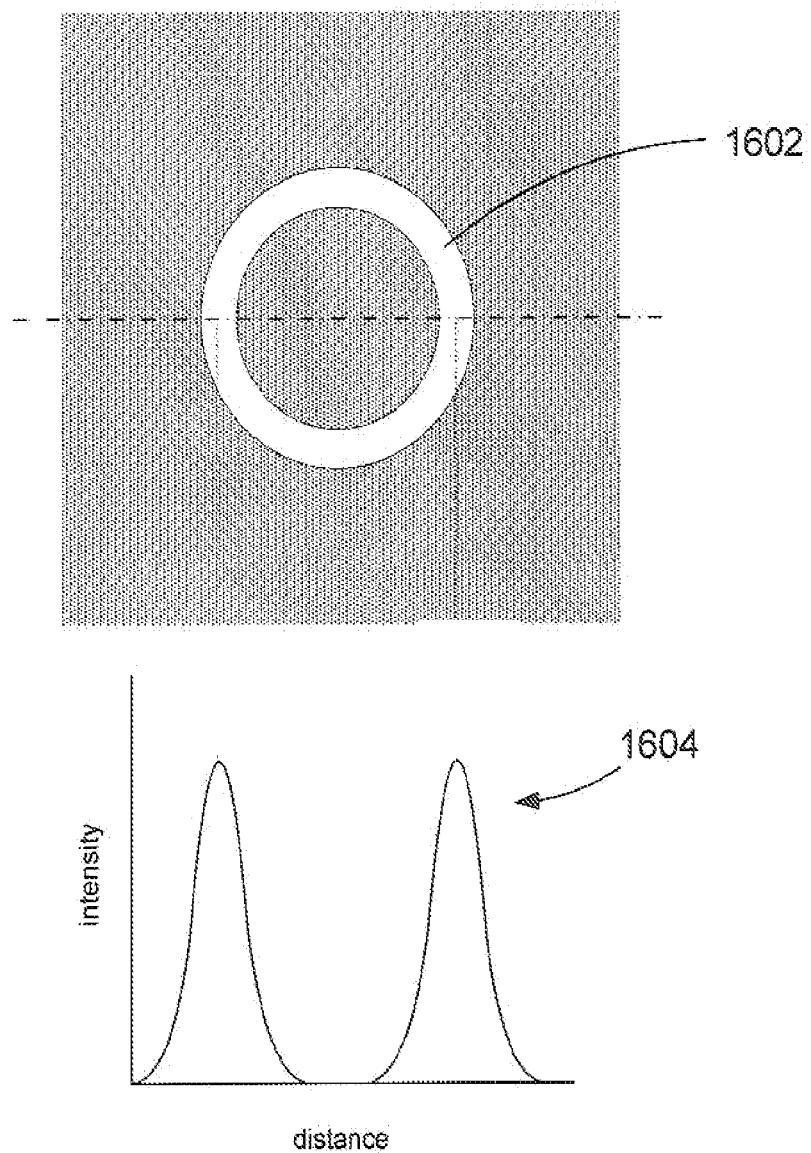
FIG. 16 shows an example cross-sectional view of a beam of light emitted from a VCSEL in accordance with one or more embodiments of the present invention.

The SWG 122 can be configured to generate beams of light with particular intensity profile patterns. FIG. 16 shows an example cross-sectional view 1602 of a beam of light emitted from a VCSEL in accordance with one or more embodiments of the present invention. The cross-sectional view 1602 reveals a beam of light with a donut-shaped intensity profile along the length of the beam. FIG. 16 also includes an intensity profile 1604 of the emitted beam. In other words, the beam of light emitted from the VCSEL has a nearly cylindrical shape. The SWG 122 can be configured to generate other kinds of cross-sectional beam patterns, such as the Airy beam or the Bessel beam profiles.

Note that the height and cavity length of VCSEL configured in accordance with embodiments of the present invention is considerably shorter than the height and cavity length of a conventional VCSEL configured with two DBRs. For example, a typical VCSEL DBR has anywhere from about 15 to about 40 DBR pairs corresponding to about 5 µm to about 6 µm, while a SWG may have a thickness ranging from about 0.2 µm to about 0.3 µm and has an equivalent or higher reflectivity.

Figure 17A:
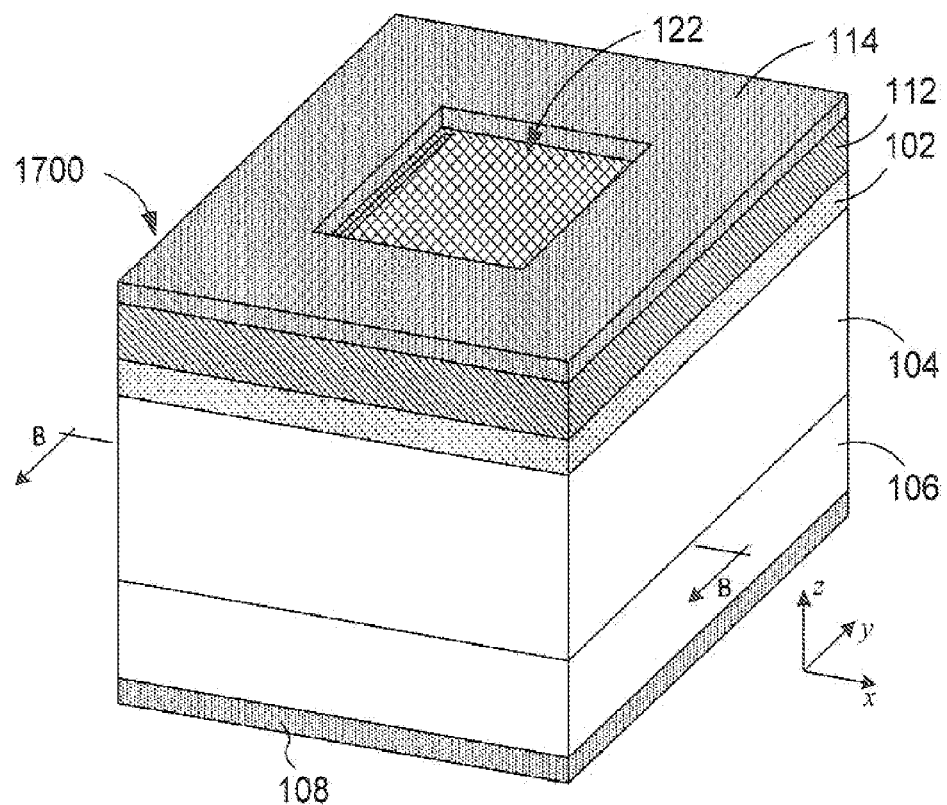
FIGS. 17A-17B show an isometric and cross-sectional view along a line B-B of an example VCSEL configured in accordance with one or more embodiments of the present invention.
Figure 17B:
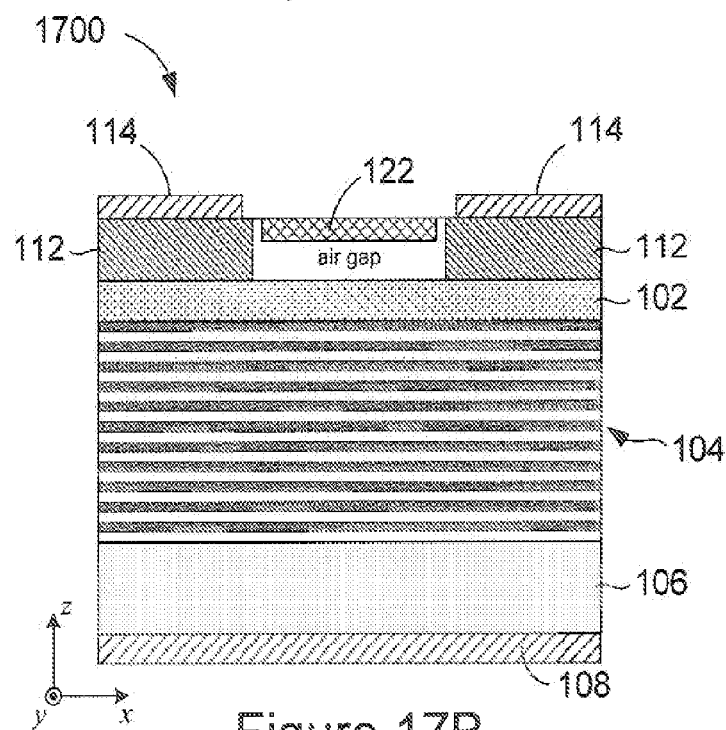

Returning to FIGS. 1 and 2, the insulating layer 110 is configured to provide current and optical confinement. However, VCSEL embodiments of the present invention are not limited to having the insulating layer 110 because the SWG can be configured to confine reflected light to a region of the light-emitting layer located between the SWG and the DBR, as described above with reference to FIG. 13A. FIGS. 17A-17B show an isometric and cross-sectional view along a line B-B of an example VCSEL 1700 configured in accordance with one or more embodiments of the present invention. The VCSEL 1700 has a nearly identical configuration as the VCSEL 100 except the insulting layer 110 of the VCSEL 100 is not present in the VCSEL 1700. Instead, the SWG 122 of the grating layer 112 is configured to direct reflected light into a region of the light-emitting layer located between the SWG 122 and the DBR 104.

Figure 18A:
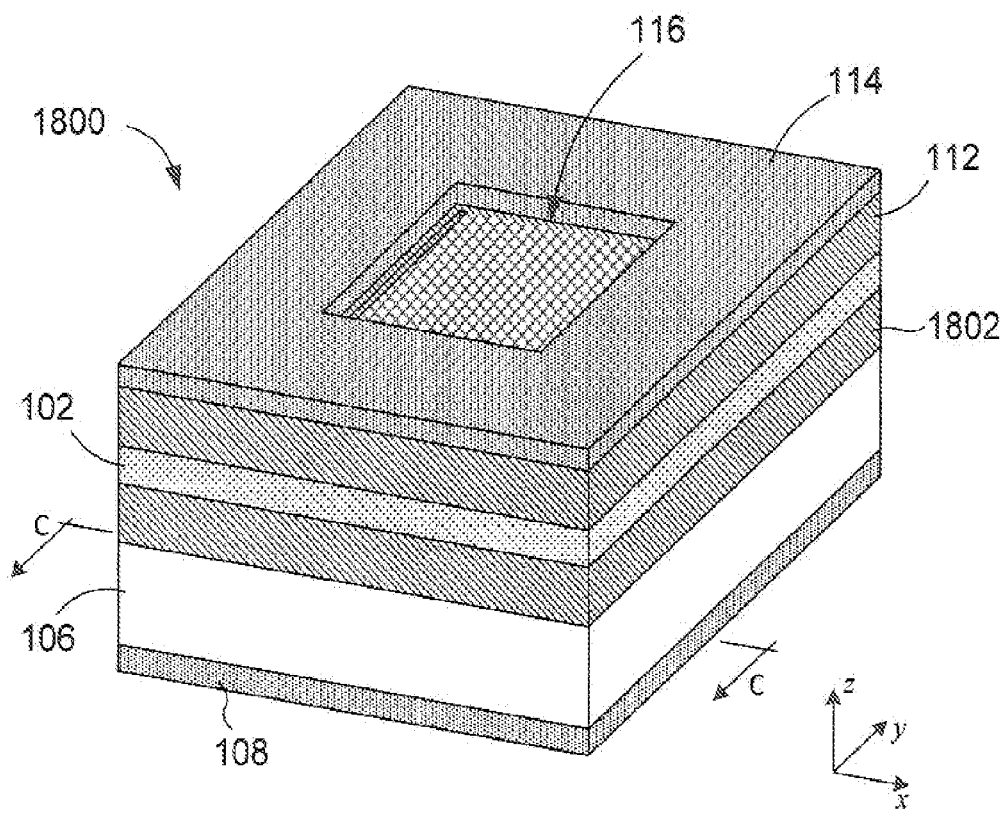
FIGS. 18A-18B show an isometric and cross-sectional view along a line C-C of an example VCSEL 1800 configured in accordance with one or more embodiments of the present invention.
Figure 18B:
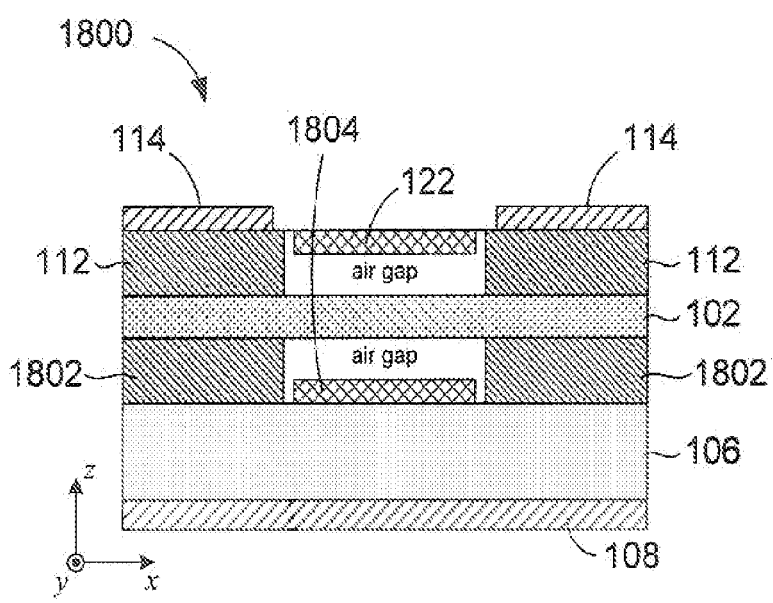

In still other embodiments of the present invention, both DBR layers of a typical VCSEL can be replaced by SWGs. FIGS. 18A-18B show an isometric and cross-sectional view along a line C-C of an example VCSEL 1800 configured in accordance with one or more embodiments of the present invention. The VCSEL 1800 has a nearly identical configuration as the VCSEL 100 except the DBR 104 is replaced by a second grating layer 1802 with a SWG 1804. As shown in FIG. 18B, the SWG 1804 is a suspended membrane with an air gap between the membrane and the light-emitting layer 102. The SWG 1804 can be configured with either a one-dimensional or two-dimensional grating pattern to operate in the same manner as the SWG 122 described above. The SWGs 122 and 1804 can be configured to direct reflected light into a region of the light-emitting layer 102, potentially eliminating the need for insulating layer 110.

Figure 19:
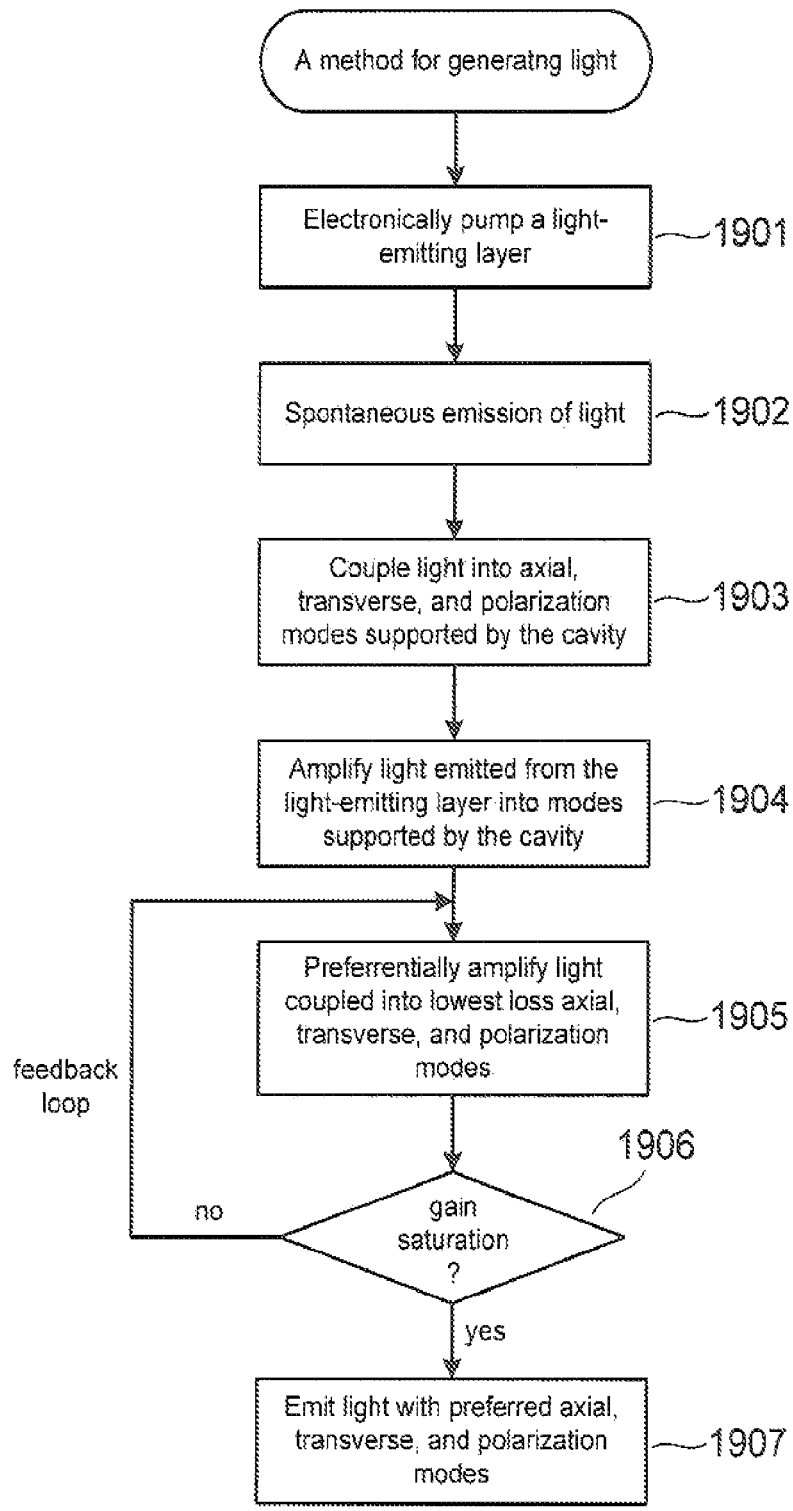
FIG. 19 shows a control-flow diagram of a method for generating light in accordance with one or more embodiments of the present invention.

FIG. 19 shows a control-flow diagram of a method for generating light in accordance with one or more embodiments of the present invention. In step 1901, a light-emitting layer disposed within a resonant cavity formed by a SWG/DBR or SWG/SWG cavity is electronically pumped as described above with reference to FIG. 11A. In step 1902, light is spontaneously emitted from the light-emitting layer in all directions. In step 1903, the spontaneously emitted light supported by the cavity is coupled into the cavity. In step 1904, the spontaneously emitted light supported by the cavity stimulates the emission of light within the cavity. As a result, the light within the cavity begins to amplify. In step 1905, stimulated light coupled into the lowest loss axial, transverse, and polarization modes is preferentially amplified by the SWG layer. In step 1906, as long as gain saturation has not been achieved, axial, transverse, and polarization modes with the lowest loss are amplified within the cavity; otherwise, in step 1907, light with the preferred axial, transverse, and polarization modes are emitted from the cavity.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A surface-emitting laser comprising:
   a grating layer configured with a non-periodic, sub-wavelength grating, the grating comprising a pattern of sub-wavelength grating features being spaced apart from each other and having a defined refractive index that is approximately equal with respect to each other, the pattern of sub-wavelength grating features comprising a plurality of sub-regions of the sub-wavelength grating features, the sub-wavelength grating features within each sub-region having dimensions corresponding to a selected period and duty cycle that is distinct with respect to the other respective sub-regions of the plurality of sub-regions;
   a reflective layer; and
   a light-emitting layer disposed between the grating layer and the reflective layer, wherein the sub-wavelength grating and the reflective layer form a resonant cavity, and the grating is configured via the pattern of sub-wavelength grating features to shape one or more internal cavity modes and to shape one or more external transverse modes of light emitted from the surface-emitting laser, wherein the pattern of sub-wavelength grating features is a one-dimensional pattern of lines separated by grooves in each of the plurality of sub-regions.

2. The surface-emitting laser of claim 1 further comprises:
a substrate disposed on the reflective layer;
a first electrode disposed on the substrate; and
a second electrode disposed on the grating layer, the second electrode configured with an opening exposing the sub-wavelength grating.

3. The surface-emitting laser of claim 1 wherein the reflective layer further comprises a distributed Bragg reflector.

4. The surface-emitting laser of claim 1 wherein the reflective layer further comprises a second grating layer configured with a second non-periodic, sub-wavelength grating.

5. The surface-emitting laser of claim 1 wherein the sub-wavelength grating further comprises a suspended membrane that forms an air gap between the sub-wavelength grating and the light-emitting layer.

6. The surface-emitting laser of claim 1 further comprising an insulating layer disposed between the light-emitting layer and the grating layer, the insulting layer includes an opening for current and optical confinement.

7. The surface-emitting laser of claim 1 wherein the light amplified within, and emitted from, the resonant cavity is polarized based on the grating pattern of the sub-wavelength grating.

8. The surface-emitting laser of claim 1 wherein the sub-wavelength grating and the reflective layer are configured to form a single mode resonant cavity for emitting a single mode of light.

9. The surface-emitting laser of claim 1, wherein each sub-wavelength feature of the pattern of sub-wavelength grating features is spaced apart from each other by air.

10. A method for generating light, the method comprising:
electronically pumping a light-emitting layer to emit light formed within a resonant cavity including one or more non-periodic, sub-wavelength gratings, each of the one or more non-periodic, sub-wavelength gratings comprising a pattern of sub-wavelength grating features that comprises a plurality of sub-regions of the sub-wavelength grating features, the sub-wavelength grating features within each sub-region having dimensions corresponding to a selected period and duty cycle that is distinct with respect to the other respective sub-regions of the plurality of sub-regions;
coupling light into axial and transverse modes supported by the cavity;
amplifying light coupled into the lowest loss axial and transverse modes supported by the cavity, based on the configuration of the one or more grating layers, to shape a wavefront of the light from a substantially planar wavefront to a substantially curved wavefront; and
emitting a coherent beam of light comprising the substantially curved wave-front matching the axial and transverse modes supported by the cavity.

11. The method of claim 10 emitting a mode of coherent beam of light further comprises emitting a single mode of light supported by the cavity.

12. The method of claim 10 further comprising amplifying modes of light with a particular polarization supported by the cavity.

13. The method of claim 12 further comprising the one or more gratings configured to reflect light with a particular polarization.

14. The method of claim 10 wherein the pattern of sub-wavelength grating features is a one-dimensional pattern of lines separated by grooves in each of the plurality of sub-regions.

15. The method of claim 10, wherein the pattern of sub-wavelength grating features are spaced apart from each other and have a defined refractive index that is approximately equal with respect to each other.

16. The method of claim 10, wherein the pattern of sub-wavelength grating features are arranged to enable the grating to operate as a cylindrical mirror or a spherical mirror to provide the substantially curved wavefront.

17. A surface-emitting laser comprising:
a grating layer configured with a non-periodic, sub-wavelength grating, the grating comprising a pattern of sub-wavelength grating features being spaced apart from each other and having a defined refractive index that is approximately equal with respect to each other, the pattern of sub-wavelength grating features comprising a plurality of sub-regions of the sub-wavelength grating features, the sub-wavelength grating features within each sub-region having dimensions corresponding to a selected period and duty cycle that is distinct with respect to the other respective sub-regions of the plurality of sub-regions;
a reflective layer; and
a light-emitting layer disposed between the grating layer and the reflective layer, wherein the sub-wavelength grating and the reflective layer form a resonant cavity, and the grating is configured via the pattern of sub-wavelength grating features to shape one or more internal cavity modes and to shape one or more external transverse modes of light emitted from the surface-emitting laser,
wherein the pattern of sub-wavelength grating features is configured to shape the one or more internal cavity modes and to shape the one or more external transverse modes to shape a wavefront of the light emitted from the surface-emitting laser from a substantially planar wavefront to a substantially curved wavefront.

18. The surface-emitting laser of claim 17 wherein the reflective layer further comprises a second grating layer configured with a second non-periodic, sub-wavelength grating.

19. The surface-emitting laser of claim 17 wherein the pattern of sub-wavelength grating features comprises a two-dimensional pattern of sub-wave-length grating features.

20. The surface-emitting laser of claim 17 wherein the sub-wavelength grating further comprises a suspended membrane that forms an air gap between the sub-wavelength grating and the light-emitting layer.

* * * * *

UNITED STATES PATENT AND TRADEMARK OFFICE
CERTIFICATE OF CORRECTION

PATENT NO.         : 9,093,819 B2
APPLICATION NO.    : 13/387030
DATED              : July 28, 2015
INVENTOR(S)        : Fattal et al.

Page 1 of 1

It is certified that error appears in the above-identified patent and that said Letters Patent is hereby corrected as shown below:

In the specification

Column 3, line 67, delete "lib" and insert -- IIb --, therefor.

In the claims

Column 15, line 25, Claim 6, delete "insulting" and insert -- insulating --, therefor.

Signed and Sealed this
Twenty-second Day of December, 2015

Michelle K. Lee
*Director of the United States Patent and Trademark Office*